(12) United States Patent
Hirakuri et al.

(10) Patent No.: US 8,394,455 B2
(45) Date of Patent: Mar. 12, 2013

(54) METHOD FOR FORMING DIAMOND-LIKE CARBON FILM

(75) Inventors: Kenji Hirakuri, Tokyo (JP); Kazuhide Ozeki, Ibaraki (JP)

(73) Assignee: Tokyo Denki University, Tokyo (JP)

(*) Notice: Subject to any disclaimer, the term of this patent is extended or adjusted under 35 U.S.C. 154(b) by 276 days.

(21) Appl. No.: 12/175,128

(22) Filed: Jul. 17, 2008

(65) Prior Publication Data
US 2009/0130325 A1    May 21, 2009

(30) Foreign Application Priority Data
Nov. 20, 2007 (JP) .................... 2007-300481

(51) Int. Cl.
*C23C 16/00* (2006.01)
*H05H 1/24* (2006.01)

(52) U.S. Cl. .................... 427/249.1; 427/569
(58) Field of Classification Search ............ 427/249.1, 427/569
See application file for complete search history.

(56) References Cited

U.S. PATENT DOCUMENTS

| | | | |
|---|---|---|---|
| 5,455,081 A * | 10/1995 | Okada et al. .................. | 427/528 |
| 5,521,351 A * | 5/1996 | Mahoney ................. | 219/121.59 |
| 6,652,969 B1 * | 11/2003 | Murakami et al. .......... | 428/408 |
| 6,893,720 B1 * | 5/2005 | Nakahigashi et al. ....... | 428/408 |
| 2003/0207115 A1 * | 11/2003 | Nagashima .................. | 428/408 |
| 2004/0219294 A1 * | 11/2004 | Massler et al. ............ | 427/249.1 |
| 2005/0084680 A1 | 4/2005 | Denes et al. | |
| 2005/0214535 A1 | 9/2005 | Denes et al. | |
| 2006/0275619 A1 | 12/2006 | Denes et al. | |
| 2010/0017346 A1 * | 1/2010 | Extrand et al. .............. | 705/400 |

FOREIGN PATENT DOCUMENTS

| | | |
|---|---|---|
| JP | 2005-2377 A | 1/2005 |
| JP | 2006-257466 | 9/2006 |
| TW | 420723 | 2/2001 |
| WO | WO-97/16580 | 5/1997 |
| WO | WO 2005/103226 | 11/2005 |

OTHER PUBLICATIONS

Jan et al. Improvement of the adhesion of diamond like carbon coatings induced by ion treatments, Mat Chem and Phys, 72 (2001) pp. 158-162.*
Kimock et al. The Evolution of Ion Beam Diamond Like Cabon Technology into Data Storage, Datatech, Diamonex, inc. (1999) pp. 69-77. Accessed from http://www.diamonex.com/resources/literature/ Jan. 19, 2012.*
Ozeki, K., et al., "The effect of nitrogen and oxygen plasma on the wear properties and adhesion strength of the diamond-like carbon film coated on PTFE," Applied Surface Science, Jul. 20, 2007.
Office Action issued for Japanese Pat. Appln. No. 2007-300481, dated Sep. 4, 2009, 2 pp.

* cited by examiner

*Primary Examiner* — Kelly M Gambetta
(74) *Attorney, Agent, or Firm* — Foley & Lardner LLP

(57) ABSTRACT

Provided is a method for forming a diamond-like carbon (DLC) film capable of enhancing the adhesion strength of a diamond-like carbon (DLC) film by simple steps. A surface of a substrate 11 made of polytetrafluoroethylene (PTFE) is modified by plasma radiation, and a diamond-like carbon film 12 is formed on the modified PTFE substrate 11 surface by chemical vapor deposition.

7 Claims, 45 Drawing Sheets

A

B

C

A

B

C

A  PTFE SUBSTRATE (NOT TREATED)
θ=103.9°

B  O₂ MODIFICATION 1(min)
θ=119.7°

C  O₂ MODIFICATION 2(min)
θ=124.0°

D  O₂ MODIFICATION 3(min)
θ=125.5°

E  N₂ MODIFICATION 1(min)
θ=89.8°

F  N₂ MODIFICATION 2(min)
θ=55.4°

G  N₂ MODIFICATION 3(min)
θ=30°

Fig. 8

| CONTACT ANGLE (°C) | | | |
|---|---|---|---|
| REACTION GAS | MODIFICATION TIME(min) | | |
| | 0 | 1 | 2 | 3 |
| $O_2$ | 103.9 | 119.7 | 124.0 | 125.5 |
| $N_2$ | 103.9 | 89.8 | 55.4 | 30.0 |

Fig. 9

| SURFACE ENERGY(mN/m) | | | | |
|---|---|---|---|---|
| REACTION GAS | MODIFICATION TIME(min) | | | |
|  | 0 | 1 | 2 | 3 |
| O₂ | 55.3 | 36.7 | 32.1 | 30.5 |
| N₂ | 55.3 | 73.0 | 114.1 | 135.8 |

| CONTACT ANGLE (°) | | | | |
|---|---|---|---|---|
| REACTION GAS | MODIFICATION TIME (min) | | | |
| | 0 | 1 | 5 | 10 |
| $O_2$ | 75.5 | 11.1 | 11.1 | 5.6 |
| $N_2$ | 75.5 | 10.1 | 10.8 | 12.0 |

Fig. 21

| SURFACE ENERGY(mN/m) | | | | |
|---|---|---|---|---|
| REACTION GAS | MODIFICATION TIME(min) | | | |
| | 0 | 1 | 5 | 10 |
| O₂ | 91.0 | 144.2 | 144.2 | 144.3 |
| N₂ | 91.0 | 144.5 | 144.3 | 144.0 |

A  MODIFICATION 0[min]   B  $O_2$ MODIFICATION 1[min]   C  $O_2$ MODIFICATION 5[min]

D  $O_2$ MODIFICATION 10[min]   E  $N_2$ MODIFICATION 1[min]   F  $N_2$ MODIFICATION 5[min]

G  $N_2$ MODIFICATION 10[min]

A

B

C

A

B

C

A NiTi SUBSTRATE
(NOT TREATED)
$\theta = 64.8°$

B $O_2$ MODIFICATION
1[min]
$\theta = 13.1°$

C $O_2$ MODIFICATION
5[min]
$\theta = 10.1°$

D $O_2$ MODIFICATION
10[min]
$\theta = 5.7°$

E $N_2$ MODIFICATION
1[min]
$\theta = 9.7°$

F $N_2$ MODIFICATION
5[min]
$\theta = 9.5°$

G $N_2$ MODIFICATION
10[min]
$\theta = 10.2°$

Fig. 30

| CONTACT ANGLE (°C) | | | | |
|---|---|---|---|---|
| REACTION GAS | MODIFICATION TIME(min) | | | |
| | 0 | 1 | 5 | 10 |
| O₂ | 64.8 | 13.1 | 10.1 | 5.7 |
| N₂ | 64.8 | 9.7 | 9.5 | 10.2 |

Fig.31

| REACTION GAS | SURFACE ENERGY(mN/m) MODIFICATION TIME(min) | | | |
|---|---|---|---|---|
| | 0 | 1 | 5 | 10 |
| $O_2$ | 103.8 | 143.7 | 144.5 | 145.2 |
| $N_2$ | 103.8 | 144.6 | 144.6 | 144.4 |

A MODIFICATION 0[min]   B O₂ MODIFICATION 1[min]   C O₂ MODIFICATION 5[min]

D O₂ MODIFICATION 10[min]   E N₂ MODIFICATION 1[min]   F N₂ MODIFICATION 5[min]

G N₂ MODIFICATION 10[min]

A  BEFORE BALL-ON DISC TEST    B  MODIFICATION 0[min]    C  $O_2$ MODIFICATION 1[min]

D  $O_2$ MODIFICATION 5[min]    E  $O_2$ MODIFICATION 10[min]    F  $N_2$ MODIFICATION 1[min]

G  $N_2$ MODIFICATION 5[min]    H  $N_2$ MODIFICATION 10[min]

A

B

C

A  Ti SUBSTRATE
(NOT TREATED)
$\theta = 38.8°$

B  $O_2$ MODIFICATION
1[min]
$\theta = 10.0°$

C  $O_2$ MODIFICATION
5[min]
$\theta = 11.4°$

D  $O_2$ MODIFICATION
10[min]
$\theta = 11.4°$

E  $N_2$ MODIFICATION
1[min]
$\theta = 8.9°$

F  $N_2$ MODIFICATION
5[min]
$\theta = 10.5°$

G  $N_2$ MODIFICATION
10[min]
$\theta = 11.9°$

Fig. 40

| CONTACT ANGLE (℃) | | | | | |
|---|---|---|---|---|---|
| REACTION GAS | MODIFICATION TIME(min) | | | | |
| | 0 | 1 | 5 | 10 | |
| O₂ | 38.8 | 10.0 | 11.4 | 11.4 | |
| N₂ | 38.8 | 8.9 | 10.5 | 11.9 | |

Fig.41

| SURFACE ENERGY(mN/m) | MODIFICATION TIME(min) | | | |
|---|---|---|---|---|
| REACTION GAS | 0 | 1 | 5 | 10 |
| $O_2$ | 129.5 | 144.5 | 144.2 | 144.2 |
| $N_2$ | 129.5 | 144.7 | 144.4 | 144.0 |

A MODIFICATION 0[min]   B O₂ MODIFICATION 1[min]   C O₂ MODIFICATION 5[min]

D O₂ MODIFICATION 10[min]   E N₂ MODIFICATION 1[min]   F N₂ MODIFICATION 5[min]

G N₂ MODIFICATION 10[min]

A

B

C

A BEFORE BALL-ON DISC TEST
B MODIFICATION 0[min]
C $O_2$ MODIFICATION 1[min]

D $O_2$ MODIFICATION 5[min]
E $O_2$ MODIFICATION 10[min]
F $N_2$ MODIFICATION 1[min]

G $N_2$ MODIFICATION 5[min]
H $N_2$ MODIFICATION 10[min]

METHOD FOR FORMING DIAMOND-LIKE CARBON FILM

CROSS-REFERENCES TO RELATED APPLICATIONS

The entire disclosure of Japanese Patent Application No. 2007-300481, filed on Nov. 20, 2007, is expressly incorporated herein by reference.

BACKGROUND

1. Technical field

The present invention relates to a method for forming a diamond-like carbon (DLC) film.

2. Related Art

DLC has high hardness, superior low friction, abrasion resistance, insulation, corrosion resistance, gas barrier property, infrared transparency and biocompatibility, and is used as a coating film in various fields.

For example, forming a DLC film on polytetrafluoroethylene (PTFE), which is a polymeric material widely used in the semiconductor industry and the like due to its excellent chemical resistance, can increase its material properties.

In medical fields, forming a DLC film on an artificial blood vessel made of PTFE or a stent made of a metallic material such as stainless steel (SUS316), nitinol (NiTi) and titanium (Ti) can improve its biocompatibility and antithrombogenicity.

DLC films are utilized in a wide variety of other fields, e.g., in machine components, cutting tools, dies, optical components, medical equipment and decoration goods.

The DLC coating can be formed by, for example, a chemical vapor deposition (CVD) method. However, the adhesion strength of the DLC film relative to polymeric materials and metallic materials is low, so it has easily peeled off from the materials. In light of such circumstances, a technique for preventing peeling of the DLC film has been proposed, in which a DLC film is formed after forming a carbon intermediate layer on a surface of a polymeric material (see, for example, JP2005-2377 A).

However, as the technique disclosed in patent document 1 involves providing the carbon intermediate layer, it makes the treatment process more complicated.

SUMMARY

This invention has been made in light of the above circumstances, and it is an object of this invention to provide a method for forming a diamond-like carbon film capable of enhancing adhesion strength of the diamond-like carbon film relative to polymeric materials and metallic materials by simple steps.

MEANS FOR SOLVING THE PROBLEM

In order to achieve the above object, the invention according to claim 1 includes: a surface modification step of modifying a surface of a substrate made of polytetrafluoroethylene by plasma radiation; and a film formation step of forming a diamond-like carbon film by chemical vapor deposition on the substrate surface modified by the plasma radiation.

The invention according to claim 2 includes: a surface modification step of modifying a surface of a substrate made of a metallic material by plasma radiation; and a film formation step of forming a diamond-like carbon film by chemical vapor deposition on the substrate surface modified by the plasma radiation.

The invention according to claim 3 has a feature in which the substrate is made of one material selected from the group consisting of stainless steel, nitinol and titanium in the method for forming the diamond-like carbon film according to claim 2.

The invention according to claim 4 has a feature in which nitrogen or oxygen is used as reaction gas in the plasma radiation in the surface modification step in the method for forming the diamond-like carbon film according to claim 1.

The invention according to claim 5 has a feature in which the plasma radiation is performed by a plasma CVD method in the surface modification step in the method for forming the diamond-like carbon film according to claim 1.

The invention according to claim 6 has a feature in which one type of gas selected from the group consisting of methane, acetylene and benzene is used as source gas for forming the diamond-like carbon film by the chemical vapor deposition in the film formation step in the method for forming the diamond-like carbon film according to claim 1.

The invention according to claim 7 has a feature in which the chemical vapor deposition is a plasma CVD method in the method for forming the diamond-like carbon film according to claim 1.

With the method for forming the diamond-like carbon film according to this invention, the adhesion strength of the diamond-like carbon film relative to polymeric materials and metal materials can be enhanced by simple steps.

BRIEF DESCRIPTION OF THE DRAWINGS

FIG. 8 is a table showing the result of the contact angle test in example 1.

FIG. 9 is a table showing surface energies of the PTFE substrates in example 1.

FIG. 20 is a table showing the result of the contact angle test in example 2.

FIG. 21 is a table showing surface energies of the stainless steel substrates in example 2.

FIG. 30 is a table showing the result of the contact angle test in example 3.

FIG. 31 is a table showing surface energies of the NiTi substrates in example 3.

FIG. 40 is a table showing the result of the contact angle test in example 4.

FIG. 41 is a table showing surface energies of the Ti substrates in example 4.

DESCRIPTION OF EXEMPLARY EMBODIMENTS

The best mode for implementing this invention will be described below with reference to the attached drawings.

In a method for forming a diamond-like carbon film according to an embodiment of this invention, a surface of a substrate made of a polymeric material such as PTFE or a metallic material such as stainless steel (SUS316), NiTi and Ti is first modified by plasma radiation.

The size and shape of the substrate may be arbitrarily selected (plate shape, sheet shape, cylindrical shape, spherical shape, etc.).

In the step of modifying the surface of the substrate by the plasma radiation (surface modification step), various plasma treatment methods for modifying the substrate surface by having atoms or molecular radical species generated by plasma bonded to and introduced into the surface of the substrate can be employed. For example, a plasma CVD method in which plasma radiation is conducted on the substrate surface using reaction gas can be employed.

Figure 1:
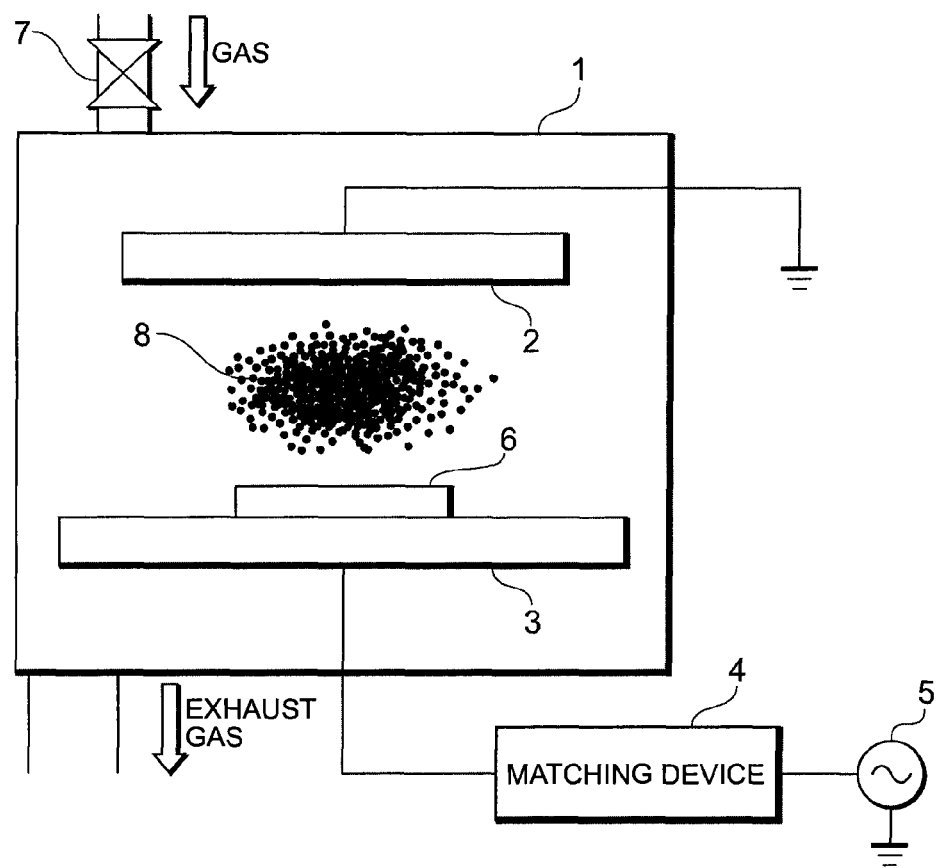
FIG. 1 is a diagram showing the outline of a plasma CVD apparatus used in a method for forming a diamond-like carbon film according to an embodiment of this invention.

FIG. 1 is a diagram showing the outline of a plasma CVD apparatus. The plasma CVD apparatus shown in FIG. 1 includes a pair of electrodes 2 and 3 placed oppositely to each other in a chamber 1, one electrode 2 being grounded and the other electrode 3 connected to a high-frequency power source 5 via a matching device. The surface of a substrate 6 is modified using this plasma CVD apparatus, specifically by mounting the substrate 6 on the electrode 3, introducing reaction gas from a gas inlet 7 and applying high-frequency voltage between the electrodes 2 and 3 by the high-frequency power source 5 to generate plasma 8.

The frequency of the high-frequency power source 5 is in the range from 100 kHz to 1000 MHz, and, for example, one using 13.56 MHz (industrial frequency) is used.

The reaction gas used in the plasma radiation may be nitrogen, oxygen, vapor, argon, etc., with nitrogen and oxygen being particularly preferable. By using such gases, the substrate surface is modified and the surface energy is increased, and accordingly, the adhesion strength of the DLC film can be enhanced.

The reaction temperature in the plasma radiation is preferably within the range that does not cause thermal alternation in the substrate, and a range of from 25° C. to 300° C. is preferable. The reaction pressure is preferably in the range of from 0.01 Pa to 100 Pa. Treatment time may be arbitrarily adjusted to be around from 1 minute to 15 minutes.

Next, a DLC film is formed on the substrate surface modified by the plasma radiation. In the step of forming the DLC film (film formation step), for example, a CVD method can be employed. The CVD method includes a plasma CVD method, a normal pressure CVD method, a low pressure CVD method, an optical CVD method, etc., with the plasma CVD method being particularly preferable.

In the plasma CVD method, treatment can be performed at a relatively low temperature (300° C. or lower) compared to other CVD methods, and a raw material is rendered to a plasma state, so the raw material can be deposited rapidly at high speed and the time for forming the DLC film can be shortened. In addition, by using the plasma CVD method also in the above-described surface modification step, the surface modification step and the film formation step can be performed continuously in the same plasma CVD apparatus.

In the CVD method, a volatile compound for a film to be formed is used as a source gas, and the volatile compound is thermally decomposed or reacted to have its product deposited and obtain a film. When a DLC film is formed, methane, acetylene, benzene, etc., can be used as the source gas, with methane being preferable.

The thickness of the DLC film to be formed is preferably between 0.01 μm and 1 μm. A thickness smaller than 0.01 μm impedes the effect of the DLC film being exerted sufficiently, while a thickness larger than 1 μm causes the DLC film to be peeled off, so both are unsuitable. The thickness of the DLC film can be adjusted by arbitrarily adjusting the reaction temperature, the reaction pressure and the treatment time.

When the DLC film is formed, the reaction temperature is preferably set to 25° C. to 300° C. so that the substrate is thermally altered. The reaction pressure is preferably between 0.01 Pa and 100 Pa. A pressure lower than this range inhibits the reaction, while a pressure higher than this range causes the DLC film to be soft, so both are unsuitable since properties inherent to the film are lost. The treatment time can be arbitrarily adjusted to be around between 0.2 minutes and 200 minutes in accordance with the thickness of the DLC film to be formed.

As described above, in the method for forming the DLC film according to this embodiment, the surface of the substrate made of a polymeric material such as PTFE or a metallic material such as stainless steel, NiTi and Ti is modified by the plasma radiation and the DLC film is formed on the modified substrate surface by the CVD method. The surface modification by the plasma radiation increases the surface energy of the substrate and enhances the adhesion strength of the DLC film relative to the substrate. Moreover, the treatment steps are not complicated.

Since a DLC film having an excellent biocompatibility can be formed with strong adherence on the PTFE, stainless steel, NiTi or Ti, which is used as a biomaterial, the surface condition of an artificial blood vessel or a stent embedded in a human body for a long time can be improved, so the artificial blood vessel or stent can be used safely for a long time.

The above embodiment of this invention will be described with reference to examples.

Example 1

Surface modification treatment was conducted by plasma radiation on a substrate (length: 10 mm×width: 10 mm×thickness: 3 mm) made of PTFE (Naflon sheet TOMBO-9000 manufactured by NICHIAS Corporation), and then a DLC film was formed on the substrate. After the surface modification treatment, an X-ray photoelectron spectroscopy measurement and a contact angle test were conducted on the substrate before forming the DLC film in order to measure the effect of the surface modification treatment. The adhesion strength and abrasion resistance of the DLC film were evaluated by a tape test, a tensile test and a ball-on disk test.
Preparation of Test Piece The substrate made of the PTFE was placed in a chamber in a high-frequency plasma CVD apparatus (PED-301 manufactured by Canon ANELVA Corporation), the chamber was put into a vacuum state (to 0.01 Pa or lower), then reaction gas was introduced at a gas flow rate of 45 sccm, and plasma was generated under the below conditions to modify the surface of the substrate.

Reaction gas: oxygen or nitrogen; Reaction pressure: 13.3 Pa; Applied electric power: 250 W (power density: 7.4 mW/mm$^2$); Distance between electrodes: 45 mm; Treatment time: 1 to 10 minutes. The substrate was ultrasonically cleaned using acetone for 10 minutes before use.

Next, a DLC film was formed on the surface-modified substrate using a plasma CVD method. After the surface modification treatment, the substrate was left in the chamber, and the chamber was put into a vacuum state (to 0.01 Pa or lower), methane gas (a raw material of the DLC film) was introduced into the chamber at a gas flow rate of 45 sccm, and the DLC film was formed by the plasma CVD method under the below conditions.

Reaction pressure: 13.3 Pa; Applied electric power: 250 W (power density: 7.4 W/mm$^2$); Distance between electrodes: 45 mm; Treatment time: 5 to 10 minutes. The thickness of the DLC film to be formed was adjusted by adjusting the treatment time, and a test piece with a DLC film having a thickness of 0.2 μm was prepared for the tensile test and a test piece with a DLC film having a thickness of 0.1 μm was prepared for the other tests.

Figure 2:
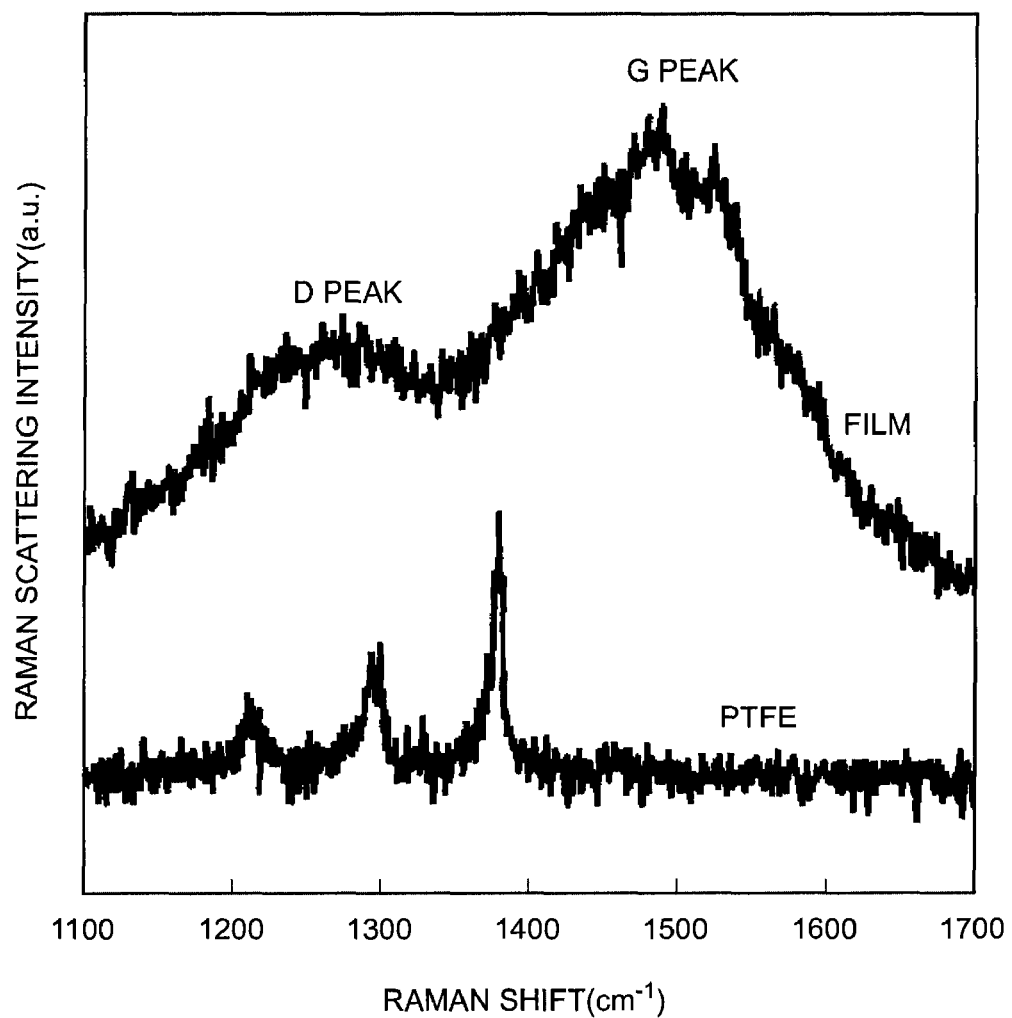
FIG. 2 is a diagram showing Raman spectrums for a PTFE substrate and a film coated on the PTFE substrate.

The film formed under the above conditions was analyzed using Raman spectroscopy (NRS-2100). FIG. 2 is a diagram showing Raman spectrums for the PTFE substrate and the film coated on the PTFE substrate. In the spectrum for the PTFE substrate, three peaks of C—C bonds were observed between 1220 and 1337 cm$^{-1}$. In the spectrum for the film, two wide Raman peaks were observed at 1304 cm$^{-1}$ and 1541 cm$^{-1}$ from a curve along the Gaussian distribution.

A Raman spectrum for a DLC film shows two wide peaks—a D band generated at about 1350 cm$^{-1}$ and considered to represent irregularly structured carbon, and a G band generated at about 1540 cm$^{-1}$ to 1580 cm$^{-1}$ and considered to represent graphite. The spectrum for the film in example 1 was close to a typical spectrum for the DLC film containing both the D band and G band. From this spectrum, formation of the DLC film on the PTFE could be verified.

XPS Measurement

The surface of the PTFE substrate after the surface modification treatment and before the formation of the DLC film was measured with an XPS apparatus (JPS-9010). The XPS measurement conditions were as follows—X-ray: MgK$_\alpha$ ray, voltage: 10.0 kV, and current: 10.0 mA.

Figure 3:
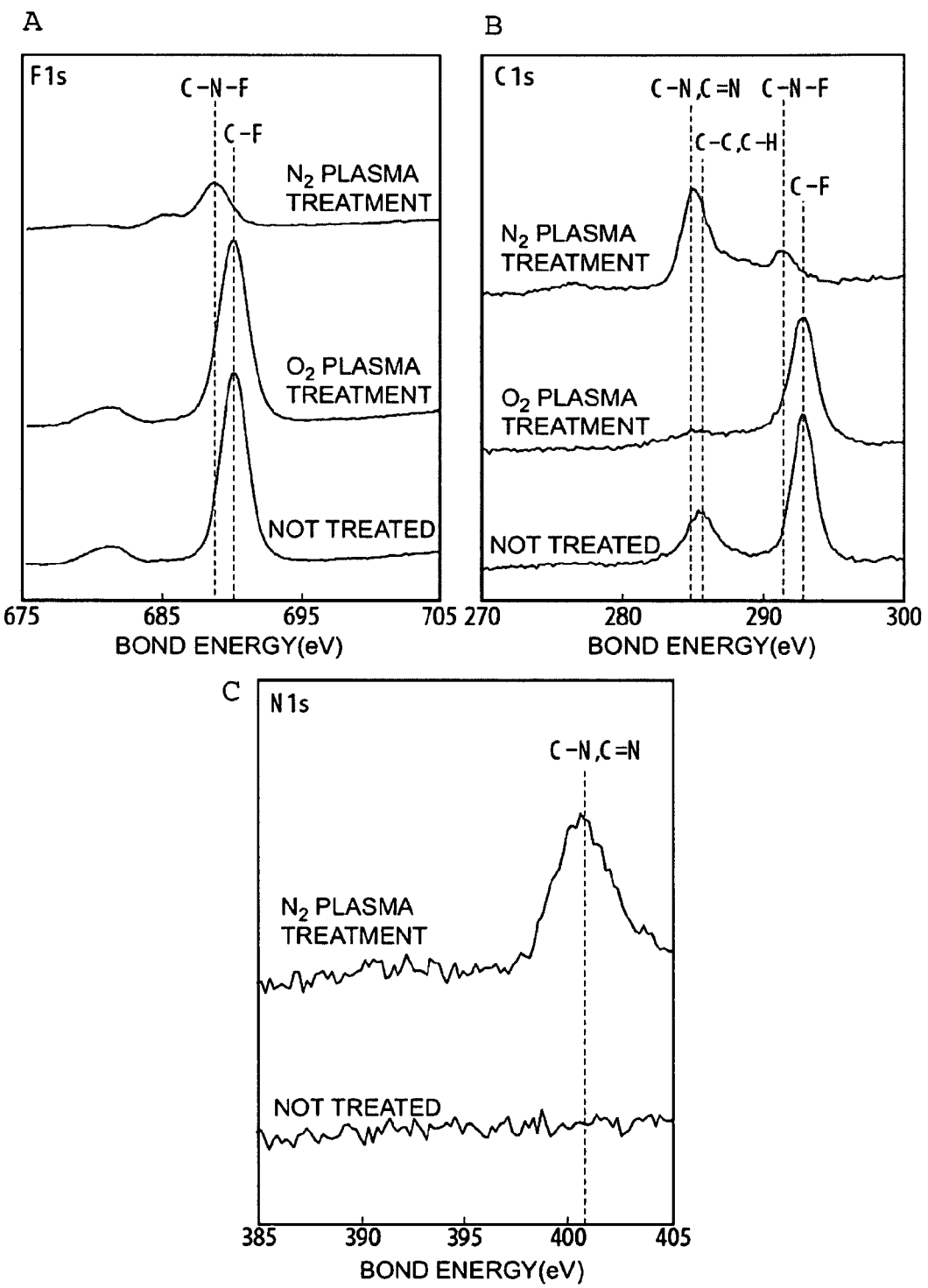
FIG. 3 is a diagram showing XPS results in example 1.

FIG. 3 is a diagram showing the XPS results for a PTFE substrate for which oxygen (O$_2$) was used as the reaction gas in the plasma treatment in the surface modification treatment, a PTFE substrate for which nitrogen (N$_2$) was used as the reaction gas, and an untreated PTFE substrate which was not subjected to surface modification treatment. FIG. 3A shows an F1s spectrum, FIG. 3B shows a C1s spectrum, and FIG. 3C shows an N1s spectrum.

As shown in FIG. 3A, in the F1s spectrum, no change could be observed between the O$_2$ plasma-treated PTFE substrate and untreated PTFE substrate. In the N$_2$ plasma-treated PTFE substrate, a decrease in C-F groups at 688.9 eV and generation of new C-N-F group at 687.4 eV were observed.

As shown in FIG. 3B, in the C1s spectrum for the O$_2$ plasma-treated PTFE substrate, the C-F peak was verified to be equal to that of the untreated PTFE substrate except for the reduction in a C-C peak at 285.4 eV. In the N$_2$ plasma-treated PTFE substrate, primary groups were C-N groups or C=N groups at 285.0 eV and C-N-F groups were observed at 291.0 eV.

As shown in FIG. 3C, in the N1s spectrum for the N$_2$ plasma-treated PTFE substrate, C-N groups or C=N groups were observed as primary groups at 400.6 eV.

Figure 4:
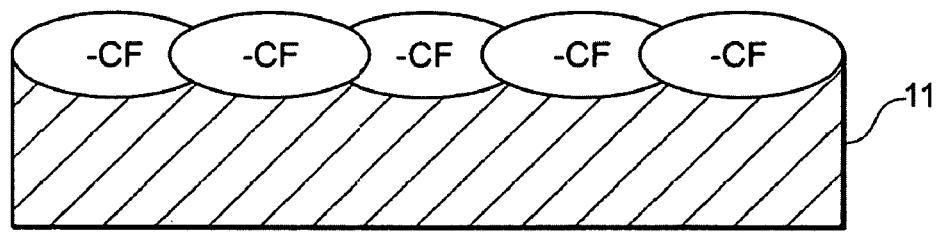
FIG. 4 is a schematic diagram showing modification states around a surface of an $O_2$ plasma-treated PTFE substrate.
Figure 4:
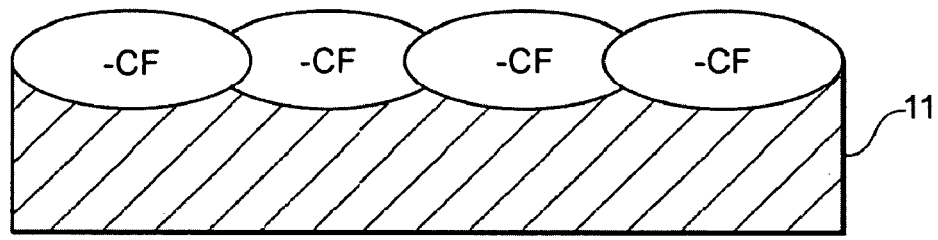
Figure 4:
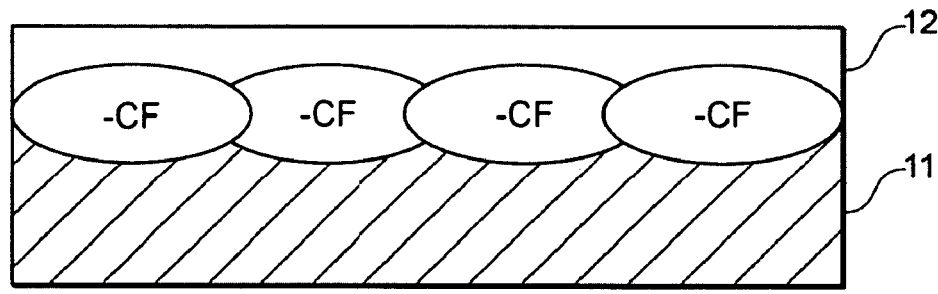
Figure 5:
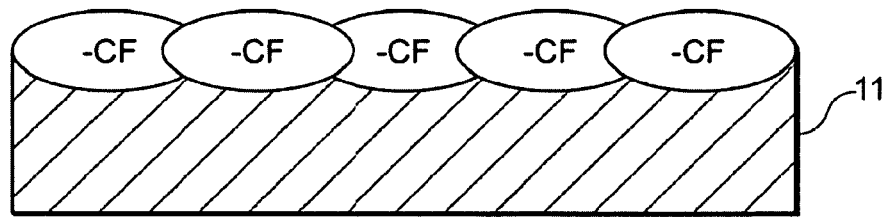
FIG. 5 is a schematic diagram showing modification states around a surface of an $N_2$ plasma-treated PTFE substrate.
Figure 5:
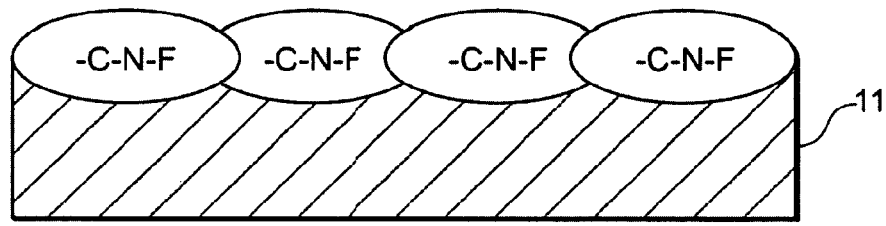
Figure 5:
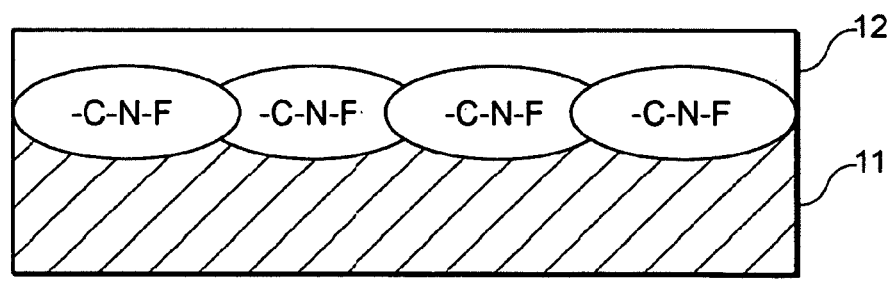

FIGS. 4A-C are schematic diagrams of modification states around the surface of the O$_2$ plasma-treated PTFE substrate, and FIG. 5A-C are diagrams showing modification states around the surface of the N$_2$ plasma-treated PTFE substrate.

As shown in FIGS. 4A and 5A, the C-F groups are primary groups in a surface of the PTFE substrate 11 before the surface modification treatment.

The above XPS results show that the $O_2$ plasma treatment caused an etching effect on the surface of the PTFE substrate 11, but the chemical composition of the surface of the PTFE substrate 11 hardly changed as shown in FIG. 4B. On the other hand, in the $N_2$ plasma treatment, the generation of the C—N groups, C=N groups and C—N—F groups around the surface of the PTFE substrate was observed as shown in FIG. 5B.

Contact Angle Test

Wet-ability of the surface of the surface-modified PTFE substrate was measured by a contact angle test before the formation of the DLC film.

The surface energy of an individual substance expresses various properties of the substance, such as absorptivity, wet-ability and adhesion strength. The surface energy can be determined by a contact angle. The contact angle is an angle formed, when liquid is dropped on a surface of a solid and a tangent line is drawn relative to a curved surface of the liquid, between the tangent line and the solid surface.

Figure 6:
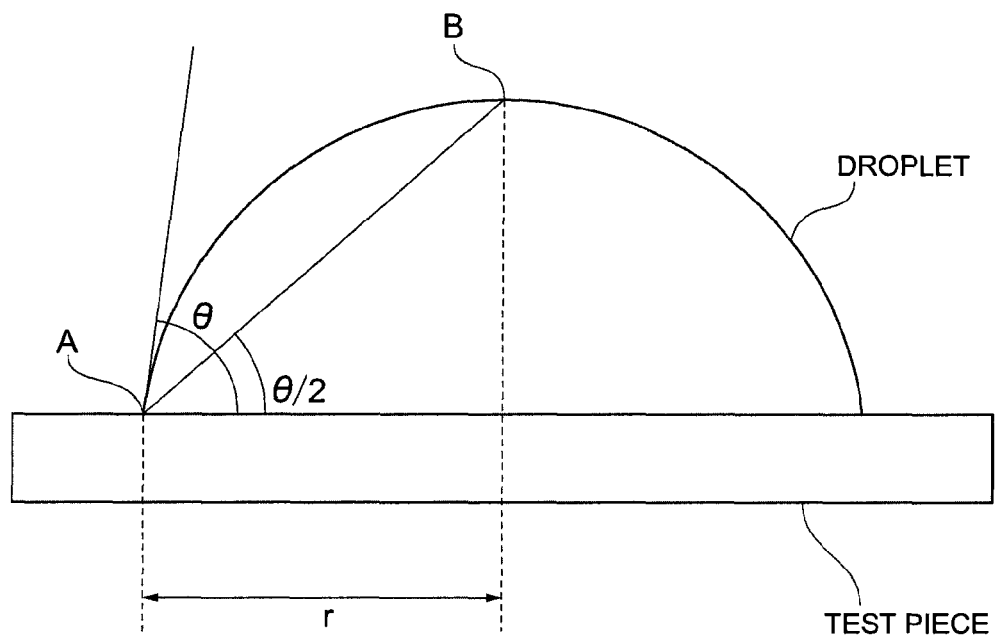
FIG. 6 is a diagram explaining a measurement method for a contact angle.
Figure 7:
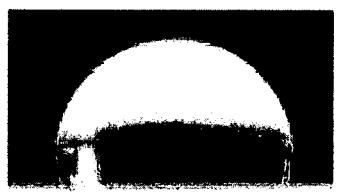
FIG. 7 shows images showing the result of the contact angle test in example 1.
Figure 7:
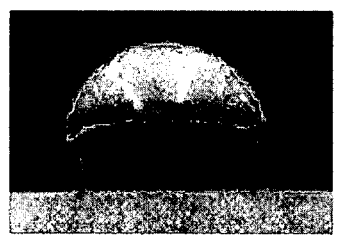
Figure 7:
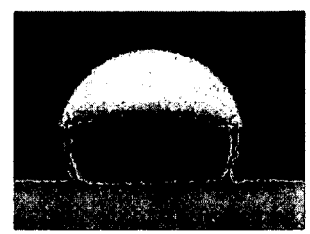
Figure 7:
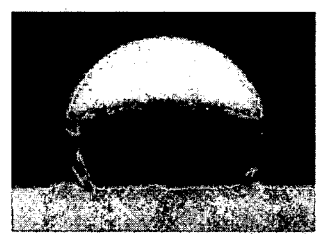
Figure 7:
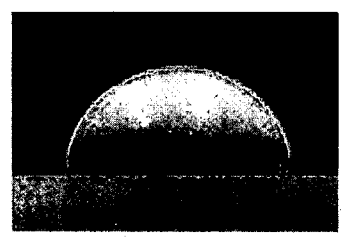
Figure 7:
Figure 7:

A measurement method for the contact angle will be described below. First, 2 μl of distilled water is dropped on a test piece using a micropipette. If the amount of the droplet is 4 μl or smaller, the shape of the droplet can be regarded as a part of a sphere, so an angle θ/2 formed by: the surface of the test piece; and a line AB connecting a contact portion A between the sample and the droplet to the top B of the droplet is read and doubled to obtain a contact angle θ, as shown in FIG. 6. The symbol r in FIG. 6 represents the radius of the area of the surface where the droplet is in contact with the test piece.

Contact angles were measured for the PTFE substrate that was surface-modified by the $O_2$ plasma treatment, the PTFE substrate that was surface-modified by the $N_2$ plasma treatment, and the untreated PTFE substrate. The contact angles were measured for the $O_2$ plasma-treated PTFE substrates and $N_2$ plasma-treated PTFE substrates respectively with treatment times of 1 minute, 2 minutes and 3 minutes.

FIGS. 7A-G show images showing the result of the contact angle test for the PTFE substrates, and FIG. 8 is a table showing the result of the contact angle test for the PTFE substrates. As shown in FIGS. 7A-G and 8, in the $O_2$ plasma-treated PTFE substrate, the contact angle increased slightly with the increase in treatment time. On the other hand, in the $N_2$ plasma-treated PTFE substrate, the contact angle rapidly decreased with the increase in treatment time.

The surface energy can be calculated using Young's equation shown in Equation 1 below.

$$E = \gamma(1 + \cos\theta) \quad \text{(Equation 1)}$$

Here, γ represents the surface tension of water at 20° C. (γ=72.8 mN/m) and θ represents the contact angle (°).

FIG. 9 is a table showing the surface energies of the PTFE substrates, calculated by Equation 1 above. In the $O_2$ plasma-treated PTFE substrates, the surface energy gradually decreased with the increase in treatment time. In consideration of the above-described XPS result, the surface of the PTFE substrate was merely etched by the $O_2$ plasma treatment, and the decrease in the surface energy with the increase in treatment time indicates that organic contaminants on the PTFE substrate surface were removed by the $O_2$ plasma etching and a clean surface appeared. As shown in FIG. 4C, by forming a DLC film 12 on the cleaned PTFE substrate 11, the adhesion strength of the DLC film 12 can be enhanced.

In the $N_2$ plasma-treated PTFE substrate, the surface energy increased with the increase in treatment time. This result shows that the chemical composition of the PTFE substrate surface was modified by the $N_2$ plasma treatment. This result is consistent with the above-described XPS result showing the generation of the C—N groups, C=N groups and C—N—F groups on the PTFE substrate surface.

The increase of the surface energy in the PTFE substrate enhances the adhesion strength between the PTFE substrate and the DLC film. As shown in FIG. 5C, by forming the DLC film 12 on the surface of the PTFE substrate 11 whose surface energy has been increased by the surface modification, the adhesion strength of the DLC film 12 can be enhanced.

Tape Test

An adhesive tape (manufactured by KYOWA LIMITED) was stuck on a DLC film-formed surface of a test piece prepared by forming the DLC film on the surface-modified PTFE substrate and then peeled off in order to observe the adhesion strength between the PTFE substrate and the DLC film.

Test pieces were prepared for the $O_2$ plasma-treated PTFE substrates and the $N_2$ plasma-treated substrates respectively with treatment times of 1, 2, 3, 4, 5, 10 minutes. Also, the same test was conducted on a test piece prepared by forming a DLC film on an untreated PTFE substrate (treatment time: 0 minute), for comparison.

Figure 10:
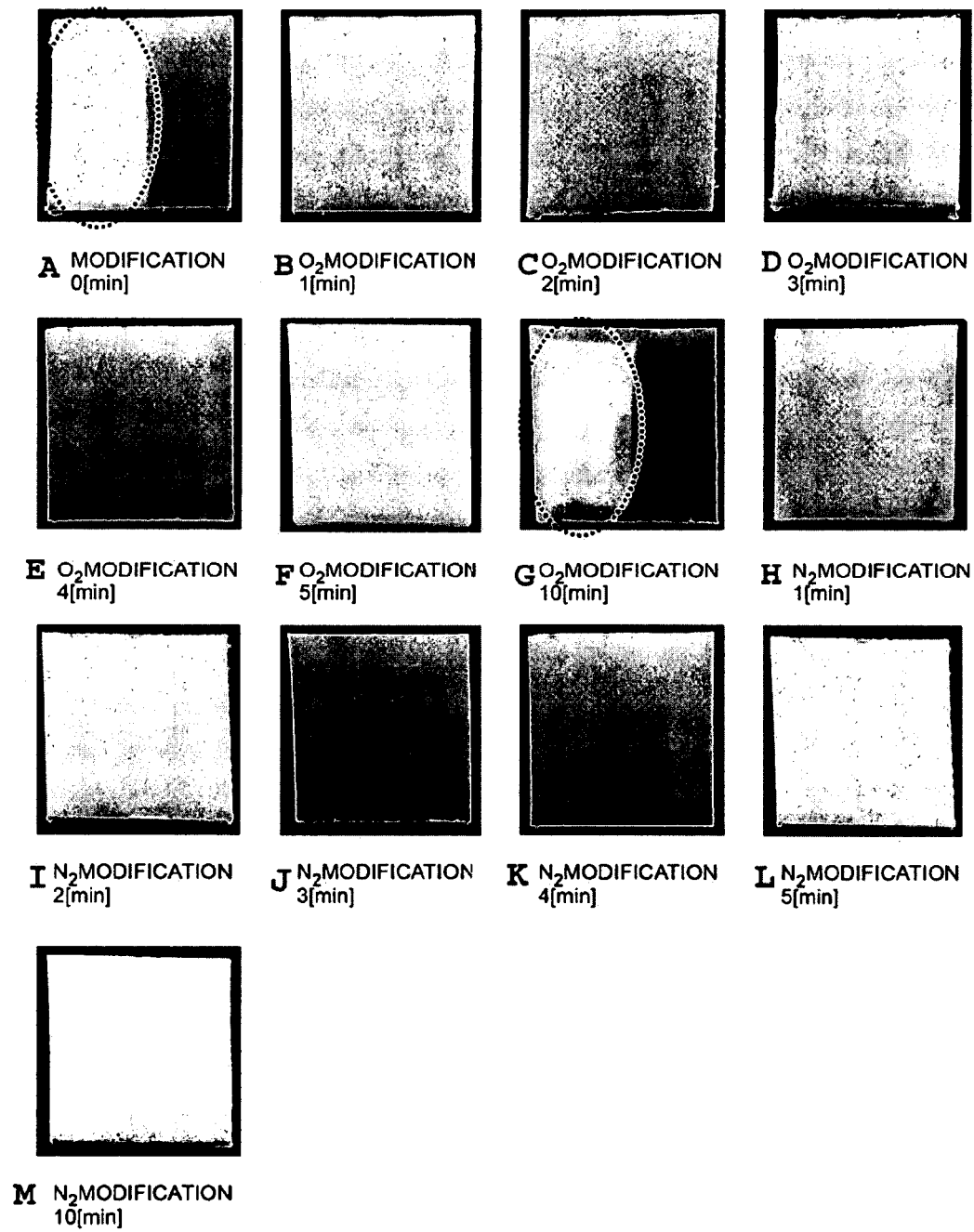
FIG. 10 shows images each showing the result of a tape test in example 1.

FIG. 10A-M show images showing the result of the tape test. The test was conducted using the left halves of the test pieces, and portions surrounded by the dotted line in the figure show peeled portions. Peeling was observed in the untreated test piece (image A in FIG. 10), but no peeling was observed in the other test pieces except the $O_2$ plasma-treated test piece with treatment time of 10 minutes (image G in FIG. 10), so it is found that the adhesion strength was enhanced.

Tensile Test

Tensile test was conducted on the test pieces each prepared by forming the DLC film on the surface-modified PTFE substrate in order to measure the adhesion strength between the PTFE substrate and the DLC film.

Figure 11:
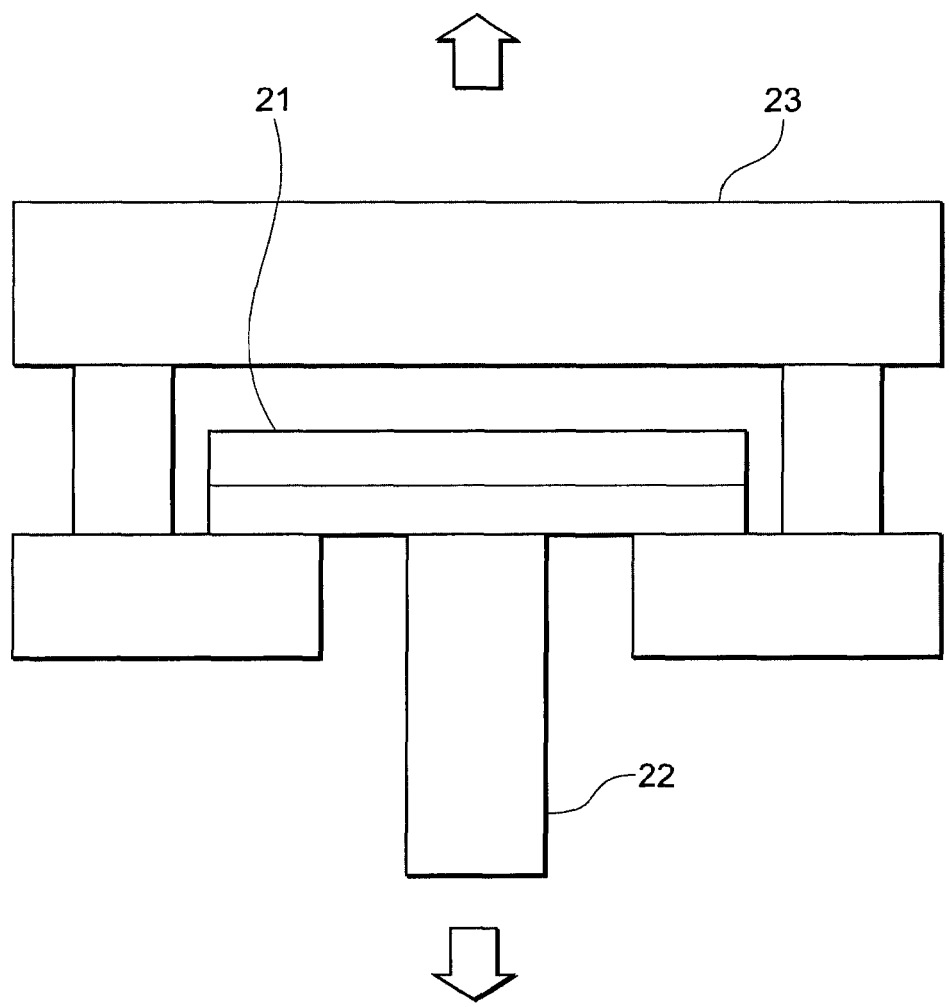
FIG. 11 is a diagram showing the outline of a tensile tester.

FIG. 11 is a diagram showing the outline of a tensile tester. An aluminum column 22 having the diameter of 6 mm was bonded to the DLC film-formed surface of a test piece 21 with adhesive (SW2214 manufactured by Sumitomo 3M LIMITED) and the test piece 21 was fixed using a fixing tool 23. The aluminum column 22 was pulled at the speed of 1 mm/min, and the force (N) when the aluminum column 22 was detached from the test piece was measured. The measured value was divided by the area of a tensile mark to obtain an adhesion strength (MPa).

Figure 12:
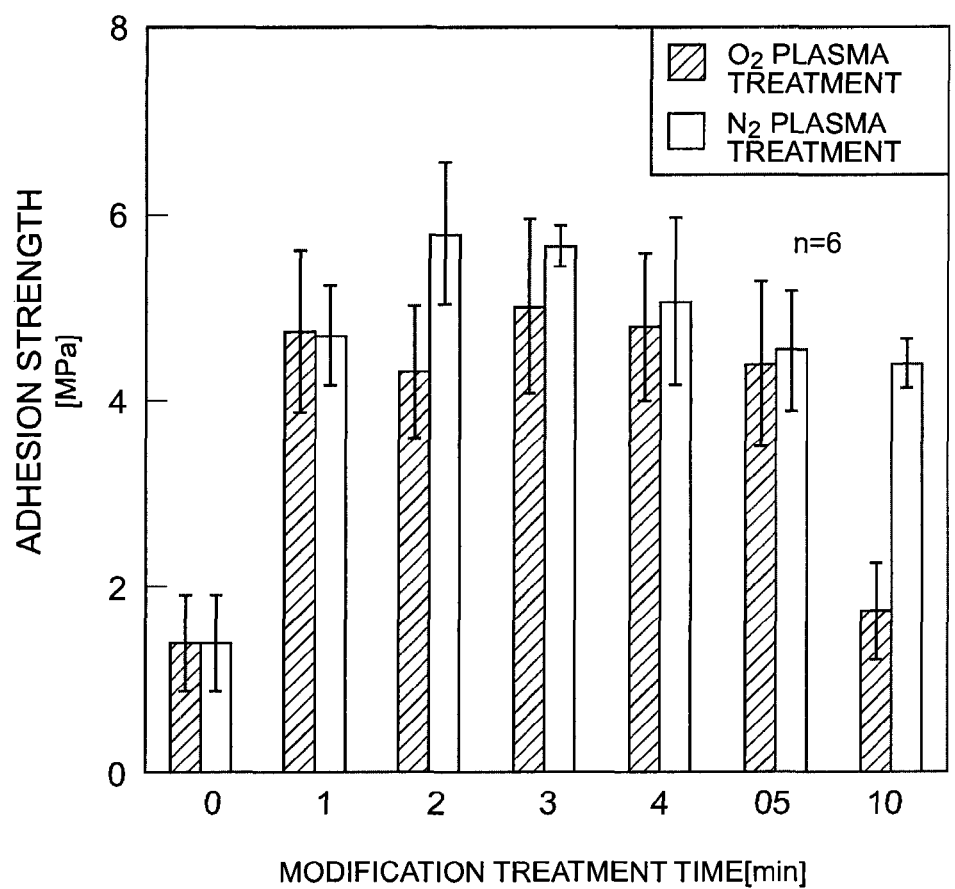
FIG. 12 is a diagram showing the result of a tensile test in example 1.
Figure 13:
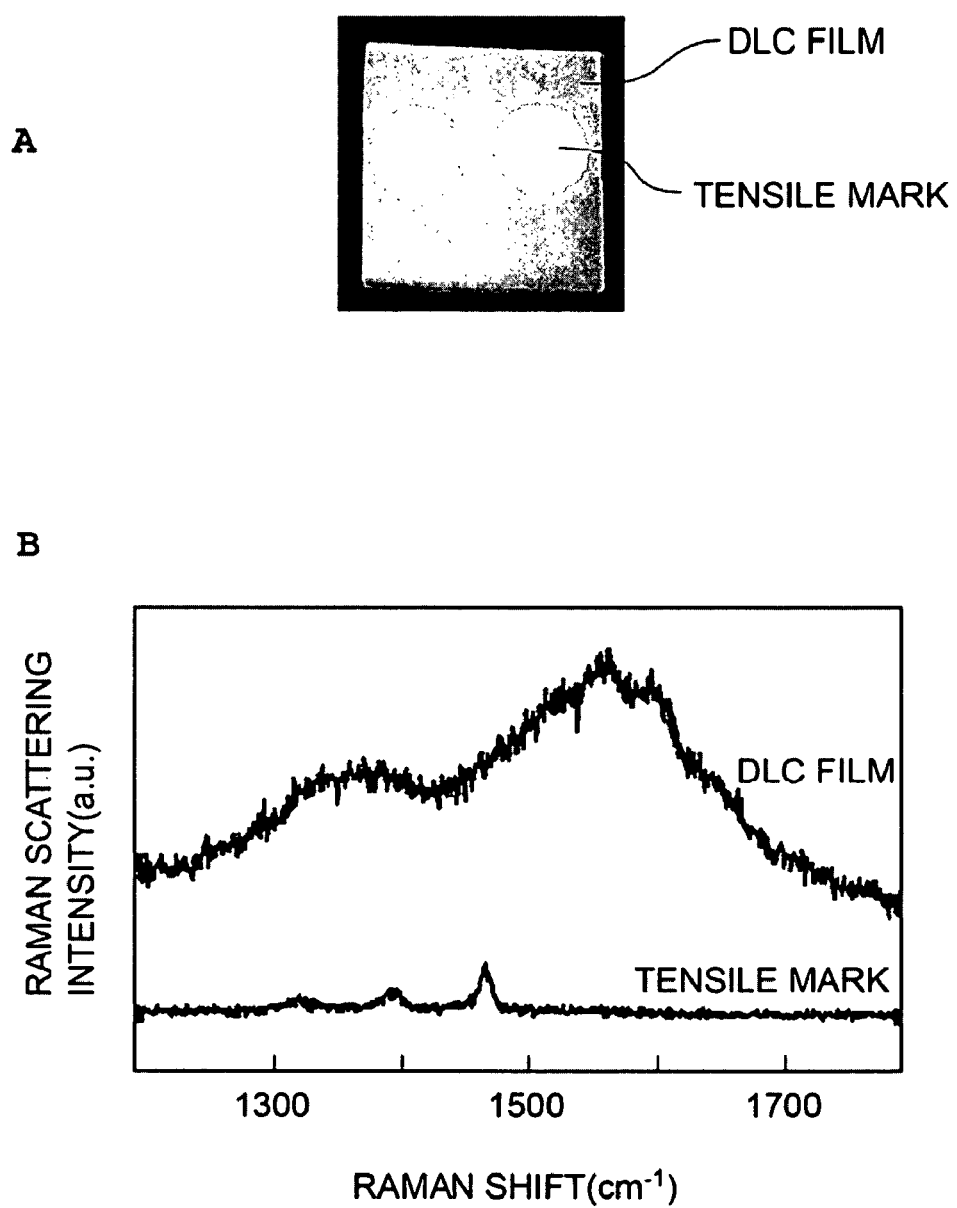
FIG. 13A is an image showing an example of a tensile mark in example 1.
FIG. 13B is a diagram showing an example of a Raman spectrum for a test piece after the tensile test in example 1.

The test was conducted for the test pieces prepared using the $O_2$ plasma treatment and the $N_2$ plasma treatment respectively with treatment times of 1, 2, 3, 4, 5 and 10 minutes. Also, the same test was conducted on a test piece prepared by forming a DLC film on an untreated PTFE substrate (treatment time: 0 minute) as a comparison. The test was conducted six times on each test piece. After the tensile test, peeling of the DLC films was checked by Raman spectroscopy FIG. 12 is a diagram showing the result of the tensile test. FIG. 13A is an image showing an example of a tensile mark, and FIG. 13B is a diagram showing an example of a Raman spectrum for a test piece after the tensile test. As shown in FIG. 12, the surface modification treatment, both by the $O_2$ plasma treatment and $N_2$ plasma treatment, greatly enhanced the adhesion strength. As seen in FIGS. 13A and 13B, the DLC film was peeled off cleanly.

The adhesion strength tends to gradually decrease when the treatment time becomes longer than two or three minutes.

This indicates that excessive plasma treatment damages the PTFE substrate surface. Accordingly, a treatment time of 2 to 3 minutes is considered to be effective.

Abrasion Resistance Test

A ball-on disk test was conducted to evaluate the abrasion resistance of the DLC film formed on the surface-modified PTFE substrate.

Figure 14:
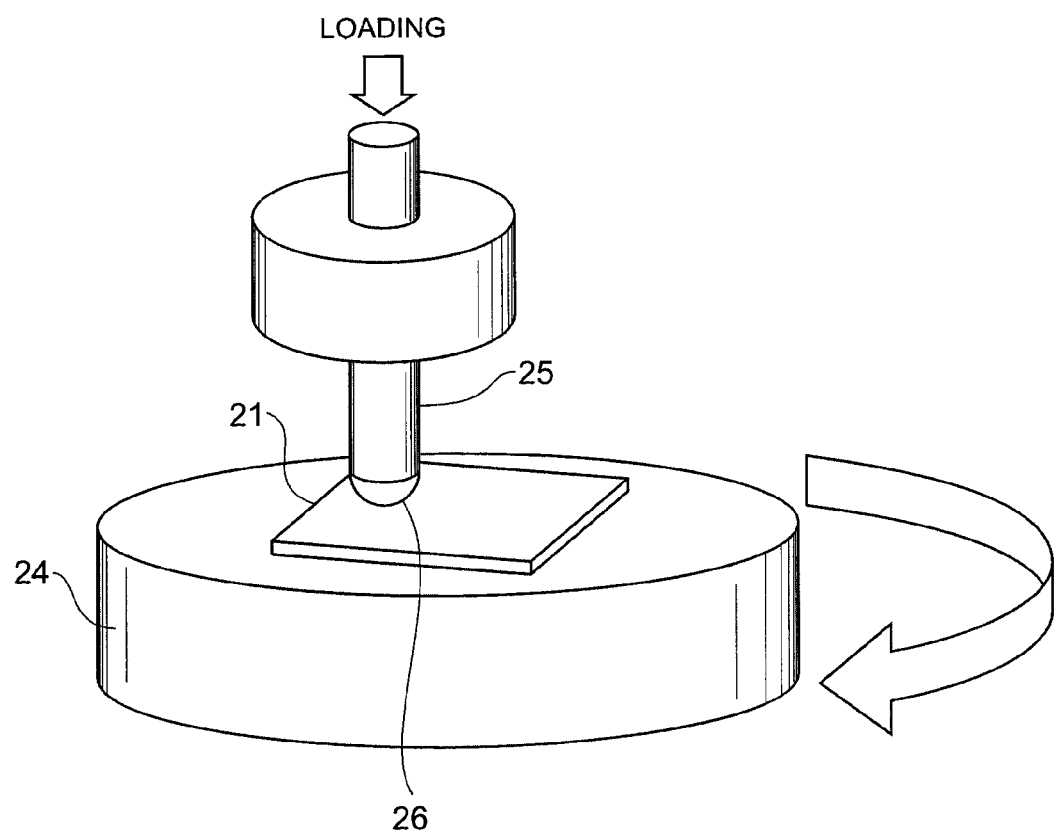
FIG. 14 is a diagram showing the outline of a ball-on disk tester.

FIG. 14 is a diagram showing the outline of a ball-on disk tester. A test piece 21 was fixed on a rotary disk 24, a constant loading was applied vertically on a test-piece ball 26 placed on a tip end of an arm 25 to keep the test-piece ball still on the test piece 21. Then the rotary disk 24 was rotated at a constant speed. The abrasion resistance was evaluated by observing the surface of the test piece 21 with a microscope after the test. Test conditions for the ball-on disk test are as follows.

Test-piece ball: stainless steel ball (diameter D=3.96 mm); Loading: 0.5 N; Rotation speed:100 rpm; Radius of rotation: 2 mm; Test time: 10 min. The test was conducted for test pieces prepared using the $O_2$ plasma treatment and $N_2$ plasma treatment respectively with treatment times of 1, 2, 3, 4, 5 and 10 minutes. Also, the same test was conducted on a test piece prepared by forming a DLC film on an untreated PTFE substrate (treatment time: 0 minutes) as a comparison.

Figure 15:
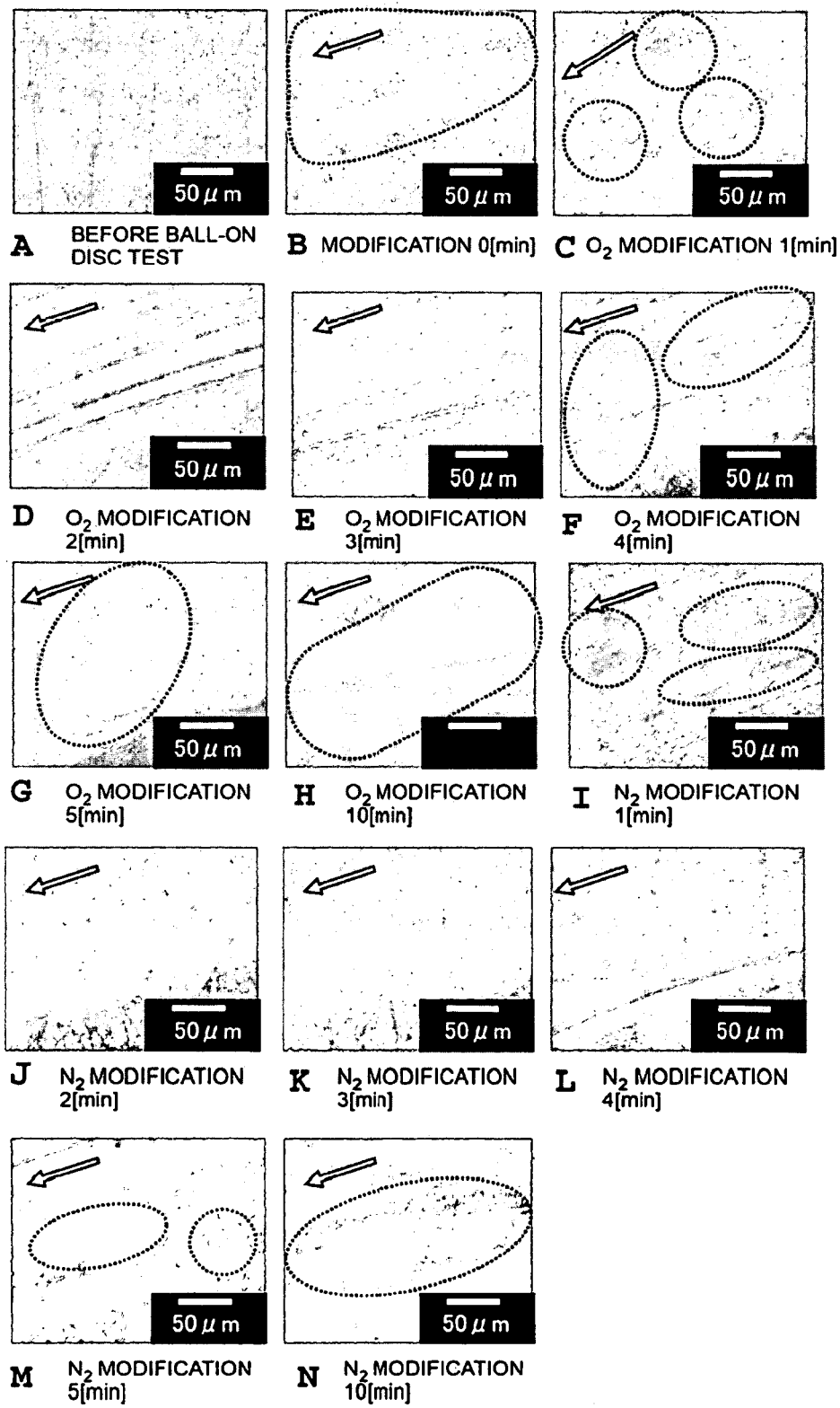
FIG. 15 shows images each showing a surface of the test piece observed after a ball-on disk test in example 1.

FIGS. 15A-N show images each showing the surface of the test piece observed after the ball-on disk test. The arrows in FIG. 15 show the rotation direction in the test and the portions surrounded by the dotted line show peeled portions. Also, an image of the observed surface of a test piece that has not been subjected to the ball-on disk test is shown for comparison in FIG. 15A.

As shown in FIG. 15B, much DLC film peeled off from the test piece that had not been subjected to the surface modification treatment. This indicates that the adhesion strength of the DLC film formed on the surface-unmodified PTFE substrate is low. Compared to this, peeling on the $O_2$ plasma-treated test pieces and $N_2$ plasma-treated test pieces was low, so it can be found that adhesion strength and abrasion resistance were enhanced FIG. 15C to N)).

Example 2

Surface modification treatment was conducted by plasma radiation on a substrate (length: 10 mm×width: 10 mm×thickness: 1 mm) made of stainless steel (SUS316 manufactured by NIKORA KABUSIKIGAISHA) using the same conditions and procedure as those in example 1, and then a DLC film was formed. Like in example 1, an XPS measurement, a contact angle test, a tape test, a tensile test and a ball-on disk test were conducted.

XPS Measurement

The surface of the stainless steel substrate after the surface modification treatment and before the formation of the DLC film was measured by XPS under the same condition as that in example 1.

Figure 16:
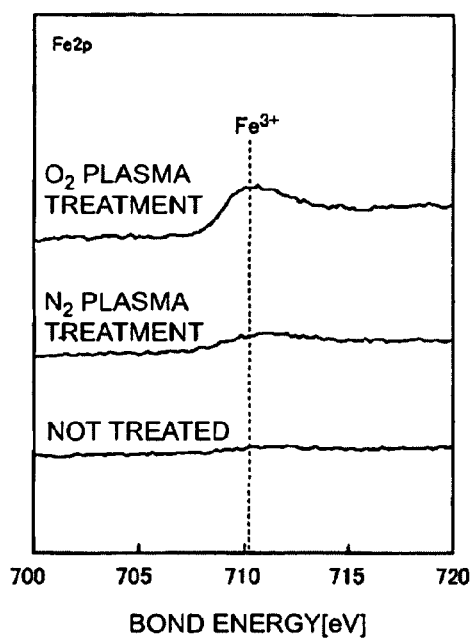
FIG. 16 is a diagram showing XPS results in example 2.
Figure 16:
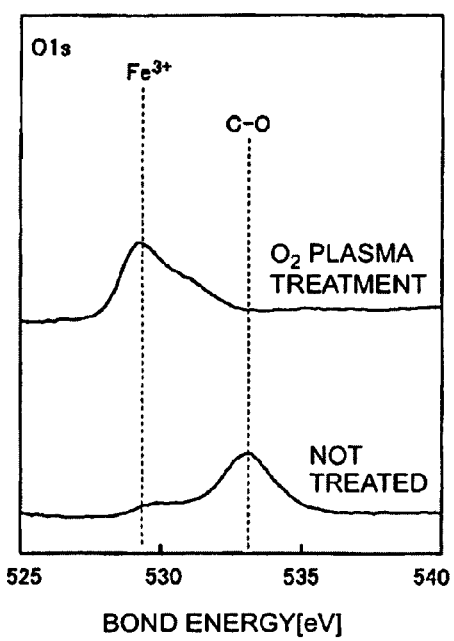
Figure 16:
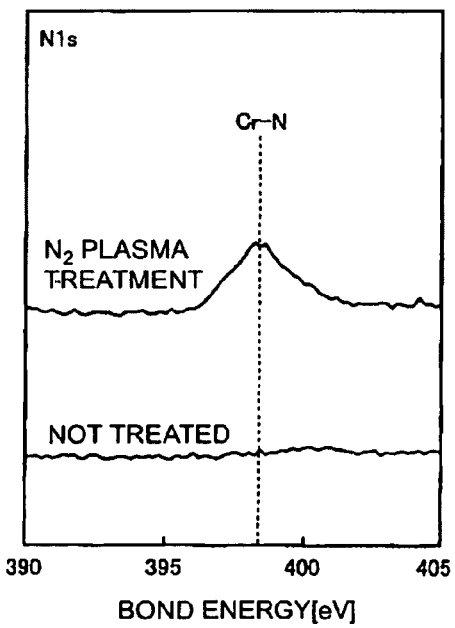
Figure 16:
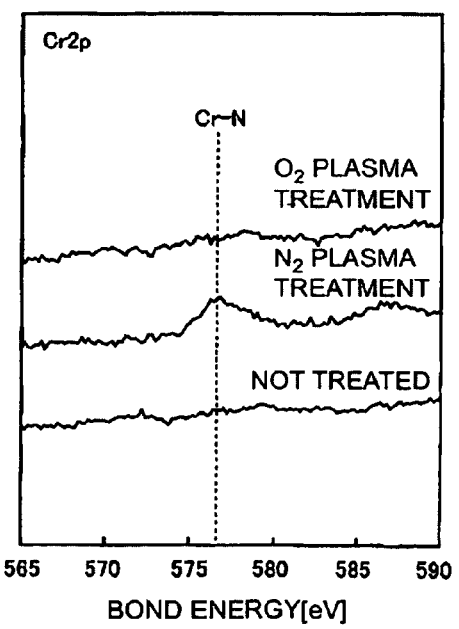

FIGS. 16A-D show diagrams showing the result of the XPS measurement for a stainless steel substrate surface-modified by the $O_2$ plasma treatment, a stainless steel substrate surface-modified by the $N_2$ plasma treatment and a surface-unmodified stainless steel substrate. FIG. 16A shows an Fe2p spectrum, FIG. 16B shows an O1s spectrum, FIG. 16C shows an N1s spectrum and FIG. 16D shows a Cr2p spectrum.

As shown FIG. 16A, in the Fe2p spectrum for the $O_2$ plasma-treated stainless steel substrate, bond energy of $Fe2p_{3/2}$ was observed between 709 and 711 eV, and this corresponds to $Fe^{3+}$. As shown in FIG. 16B, in the O1s spectrum for the $O_2$ plasma-treated stainless steel substrate, the peak of $Fe^{3+}$ was observed between 529 and 530 eV. These results show that $F_2O_3$ was generated around the surface of the stainless steel substrate by the $O_2$ plasma treatment.

As shown in FIG. 16C, in the N1s spectrum for the $N_2$ plasma-treated stainless steel substrate, the generation of Cr—N groups was observed at 397.1 eV. As shown in FIG. 16D, in the Cr2p spectrum for the $N_2$ plasma-treated stainless steel substrate, the generation of Cr—N groups was observed at 576.5 eV. These results indicate that CrN bond was generated around the surface of the stainless steel substrate by the $N_2$ plasma treatment.

Figure 17:
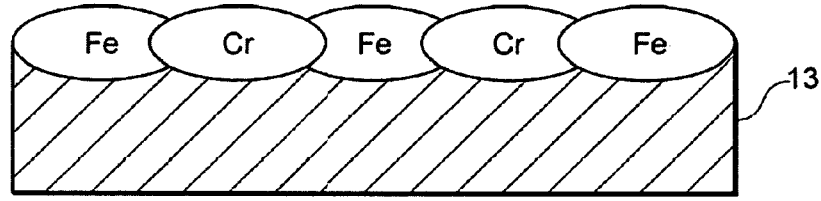
FIG. 17 is a schematic diagram showing modification states around a surface of an $O_2$ plasma-treated stainless steel substrate.
Figure 17:
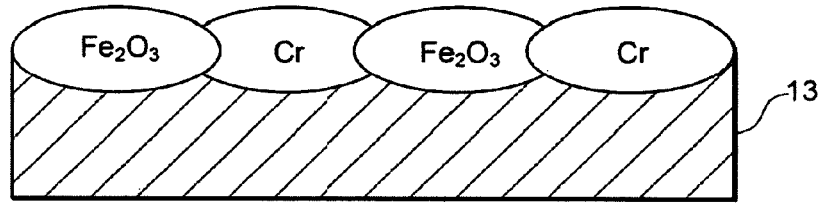
Figure 17:
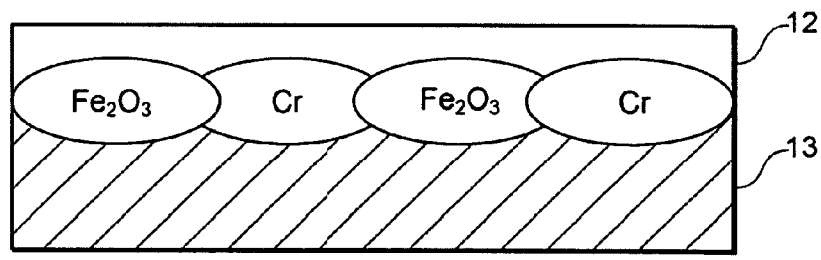
Figure 18:
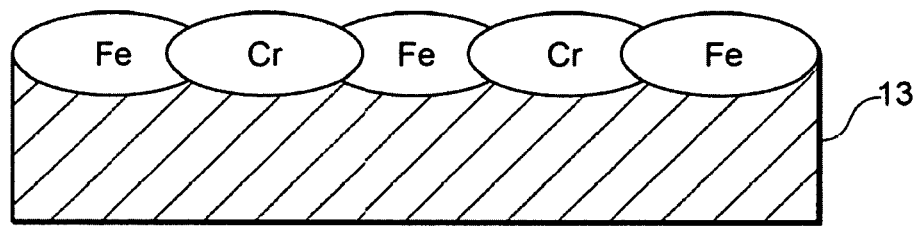
FIG. 18 is a schematic diagram showing modification states around a surface of a $N_2$ plasma-treated stainless steel substrate.
Figure 18:
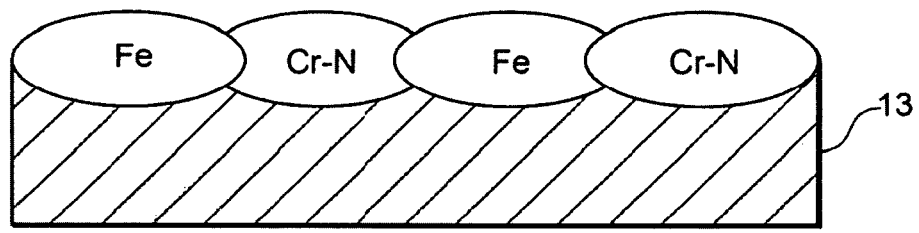
Figure 18:
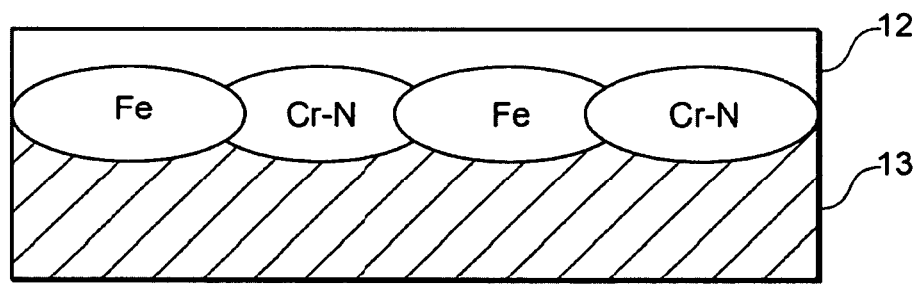
Figure 19:
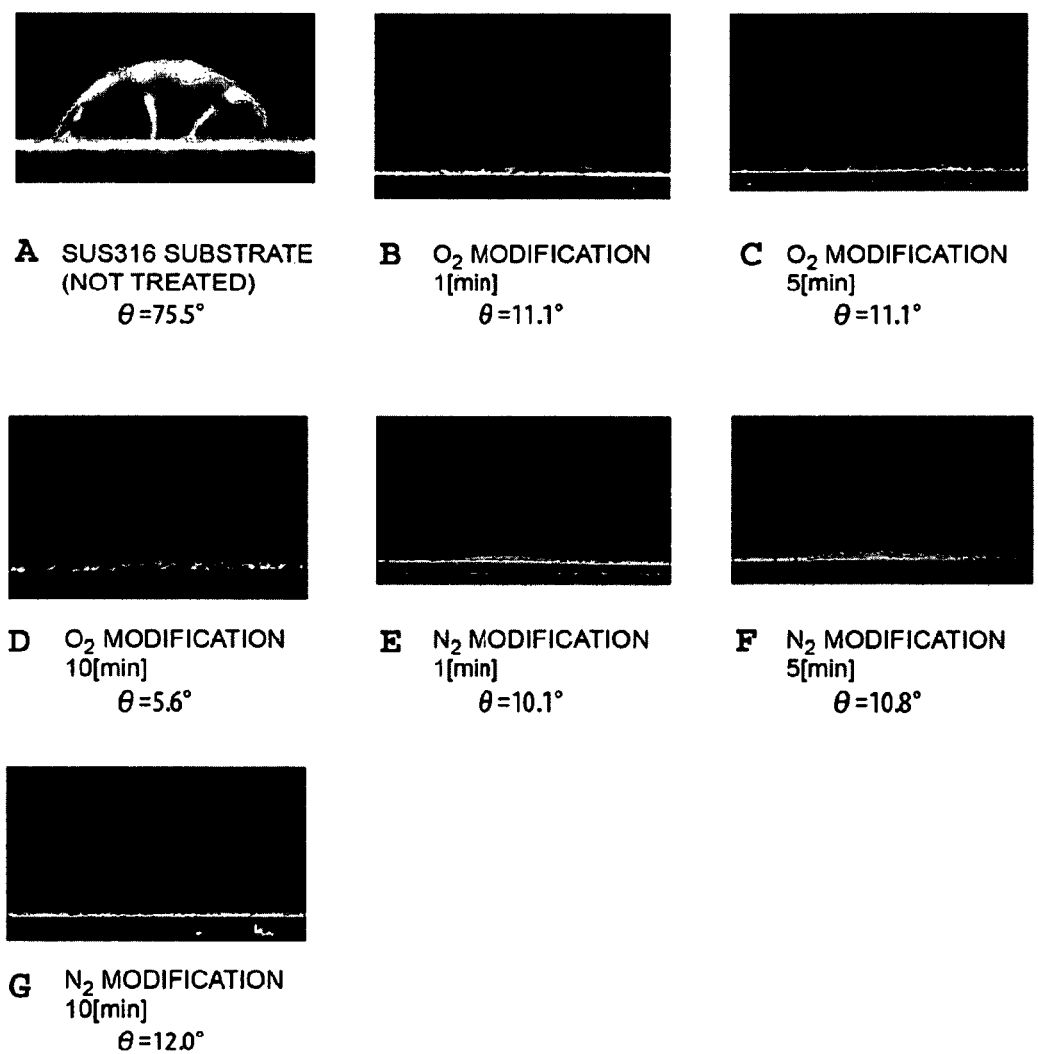
FIG. 19 shows images each showing the result of a contact angle test in example 2.
Figure 22:
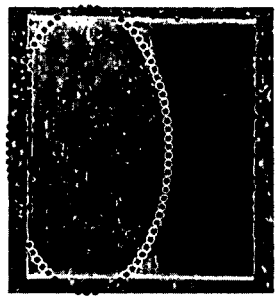
FIG. 22 shows images each showing the result of a tape test in example 2.
Figure 22:
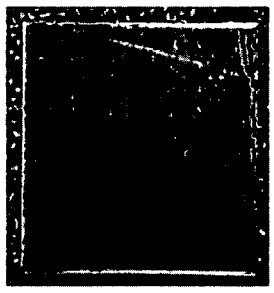
Figure 22:
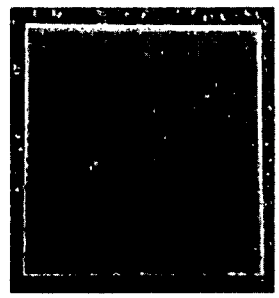
Figure 22:
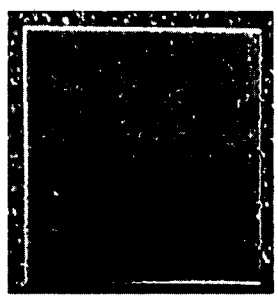
Figure 22:
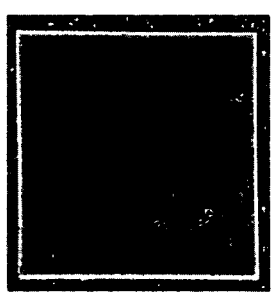
Figure 22:
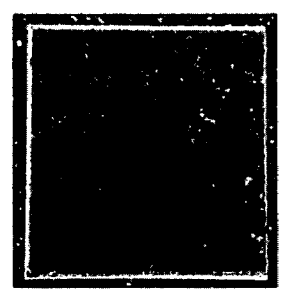
Figure 22:
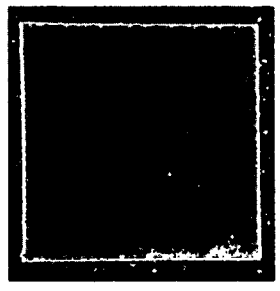

FIGS. 17A-C show schematic diagrams each showing a modification state around the surface of the $O_2$ plasma-treated stainless steel substrate, and FIGS. 18A-C show schematic diagrams each showing a modification state around the surface of the $N_2$ plasma-treated stainless steel substrate. As shown in FIGS. 17A and 18A, the portion around the surface of a stainless substrate 13 before the surface modification treatment is mainly composed of Fe and Cr.

The above results of the XPS measurement indicate that $F_2O_3$ was generated around the surface of the stainless steel substrate 13 by the $O_2$ plasma treatment as shown in FIG. 17B and CrN was generated around the surface of the stainless steel substrate 13 by the $N_2$ plasma treatment as shown in FIG. 18B.

Contact Angle Test

Wet-ability of the surface of the stainless steel substrate after the surface modification treatment and before the formation of the DLC film was measured by the same contact angle test as in example 1.

Contact angles were measured for the stainless steel substrate surface-modified by the $O_2$ plasma treatment, the stainless steel substrate surface-modified by the $N_2$ plasma treatment and the untreated stainless steel substrate. The contact angles were measured for the $O_2$ plasma-treated stainless substrates and $N_2$ plasma-treated stainless substrates respectively with treatment times of 1, 5 and 10 minutes.

FIGS. 19A-G show images showing the results of the contact angle test for the stainless steel substrates. FIG. 20 is a table showing the results of the contact angle test for the stainless steel substrates, and FIG. 21 is a table showing the surface energies of the stainless steel substrates calculated by Equation 1 above. As shown in FIGS. 19A-G to 21, the contact angle decreased and the surface energy increased in each of the $O_2$ plasma-treated stainless steel substrates and $N_2$ plasma-treated stainless steel substrates, compared to those in the untreated substrate.

These results indicate that the chemical composition of the surfaces of the stainless steel substrates was modified due to the $O_2$ plasma treatment and $N_2$ plasma treatment. This result is consistent with the results in the above XPS measurement in which $F_2O_3$ was detected from the portion around the $O_2$ plasma-treated Ti substrate and CrN was detected from the portion around the surface of the $N_2$ plasma-treated Ti substrate.

The increase of the surface energy of the stainless steel substrate enhances the adhesion strength between the stainless steel substrate and the DLC film. As shown in FIGS. 17C and 18C, by forming the DLC film 12 on the surface of the stainless steel substrate 13 whose surface energy has been increased due to the surface modification, the adhesion strength of the DLC film 12 can be enhanced.

Tape Test

The adhesion strength between the stainless steel substrate and the DLC film was observed by the same tape test as that used in example 1.

The test was conducted for test pieces prepared using the $O_2$ plasma treatment and the $N_2$ plasma treatment respectively with treatment times of 1, 5 and 10 minutes. Also, the same test was conducted for a test piece prepared by forming a DLC film on an untreated stainless substrate (treatment time: 0 minutes) for comparison.

FIGS. 22A-G show images showing the results of the tape test. The test was conducted using the left halves of the test pieces, and portions surrounded by the dotted line in the figure show peeled portions. Peeling was observed in the untreated test piece (FIG. 22A), but no peeling was observed in the other test pieces, so it could be seen that adhesion strength was enhanced.

Tensile Test

The adhesion strength between the stainless steel substrate and the DLC film was measured by the same tensile test as that used in example 1.

The test was conducted for test pieces prepared by the $O_2$ plasma treatment and $N_2$ plasma treatment respectively with treatment times of 1, 5 and 10 minutes. Also, the same test was conducted for a test piece prepared by forming a DLC film on an untreated stainless steel substrate (treatment time: 0 minutes) for comparison. The measurement was conducted six times for each test piece. After the tensile test, peeling of the DLC film was checked by Raman spectroscopy.

Figure 23:
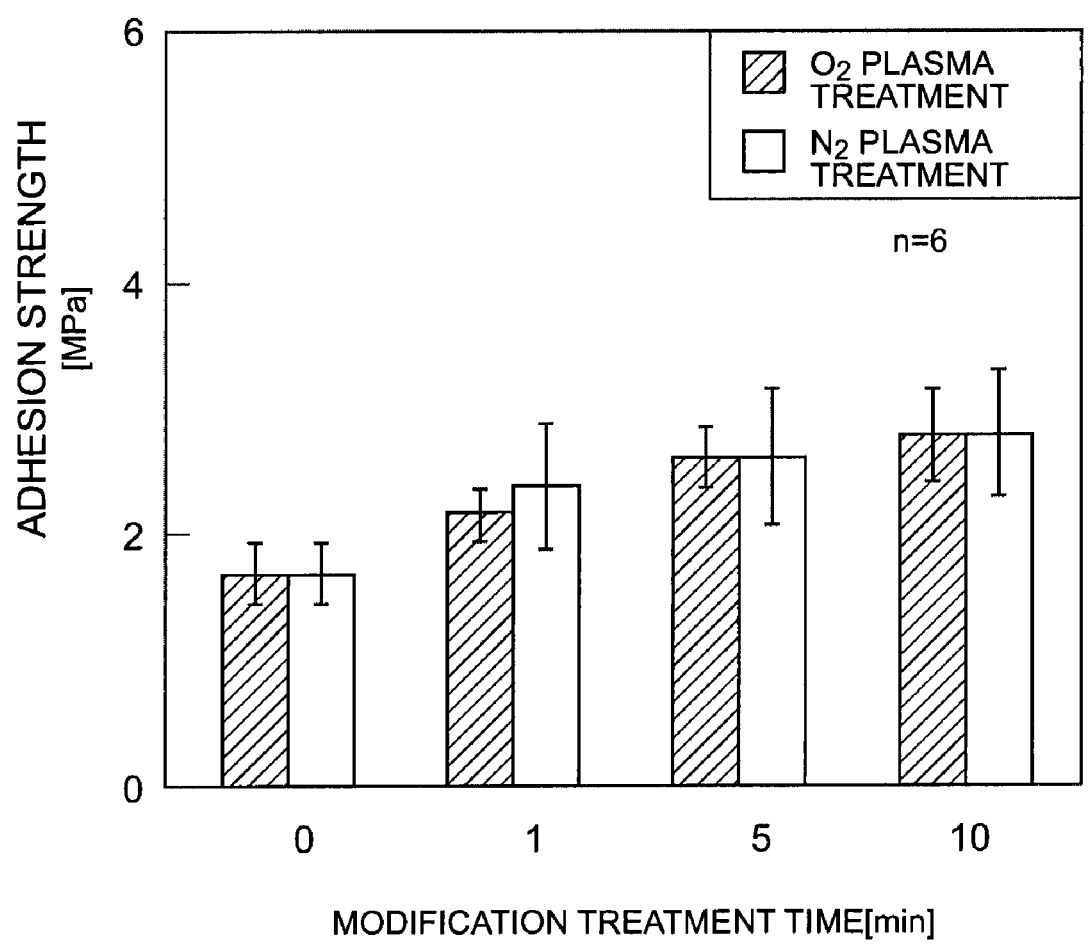
FIG. 23 is a diagram showing the result of a tensile test in example 2.
Figure 24:
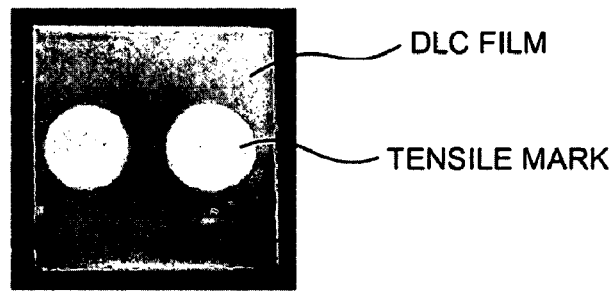
FIG. 24A is an image showing an example of a tensile mark in example 2.
FIG. 24B is a diagram showing an example of a Raman spectrum for a test piece after the tensile test in example 2.
Figure 24:
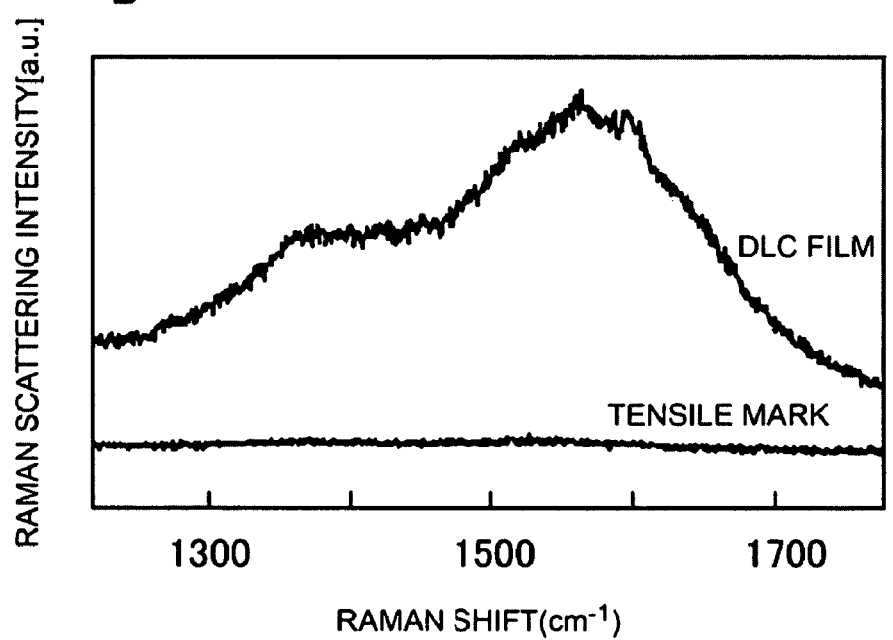

FIG. 23 is a diagram showing the result of the tensile test. FIG. 24A is an image showing an example of a tensile mark, and FIG. 24B is a diagram showing an example of a Raman spectrum for a test piece after the tensile test. As shown in FIG. 23, the surface modification treatment, both the $O_2$ plasma treatment and $N_2$ plasma treatment increased the adhesion strength, and the adhesion strength increased with the increase in treatment time. FIG. 24A and FIG. 24B show that the DLC film was peeled off cleanly.

Abrasion Resistance Test

The abrasion resistance of the DLC film formed on the surface-modified stainless steel was evaluated by the same ball-on disk test as that used in example 1.

The test was conducted for the test pieces prepared using the $O_2$ plasma treatment and $N_2$ plasma treatment respectively with treatment times of 1, 5 and 10 minutes. Also, the same test was conducted for a test piece prepared by forming a DLC film on an untreated stainless steel substrate (treatment time: 0 minutes) for comparison.

Figure 25:
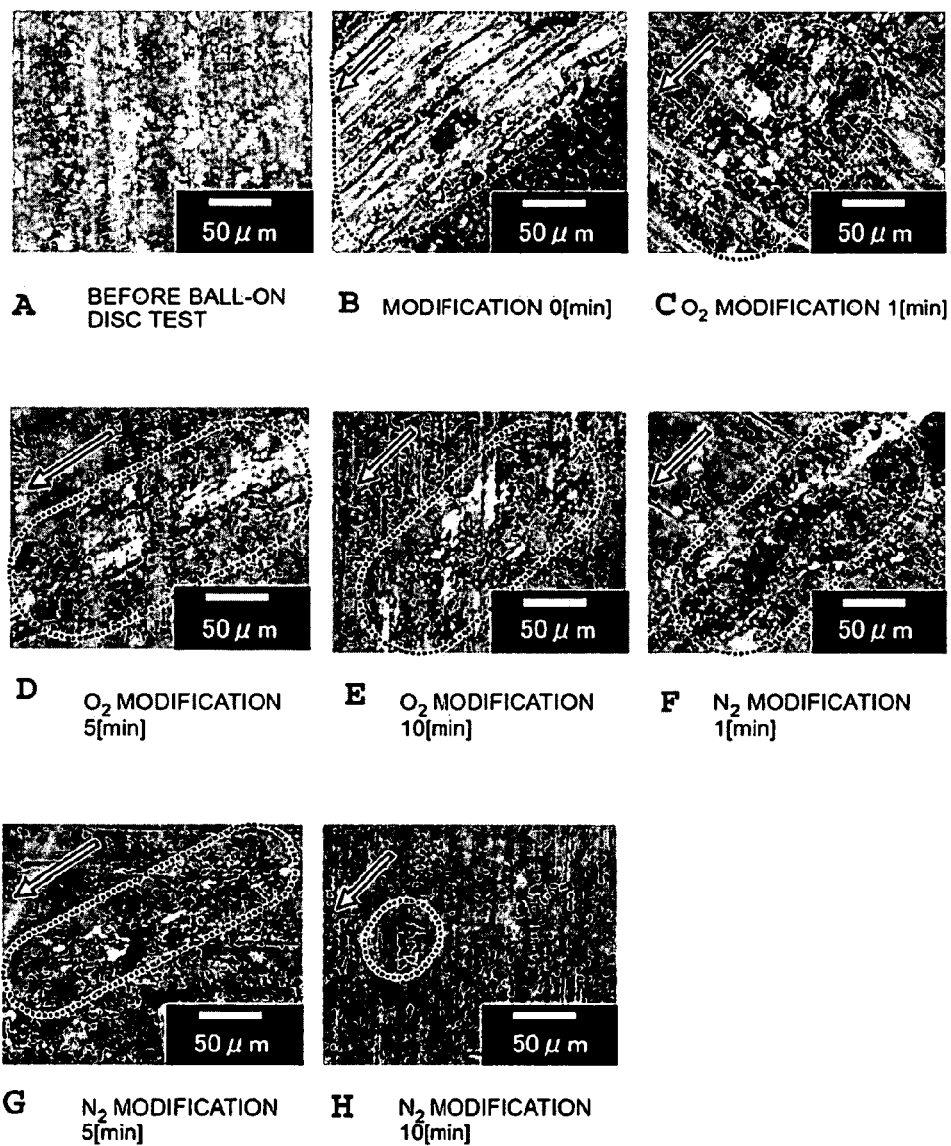
FIG. 25 shows images each showing a surface of a test piece observed after the ball-on disk test in example 2.

FIGS. 25A-H show images each showing test piece surfaces observed after the ball-on disk test. The arrows in the figure show a rotation direction in the test, and portions surrounded by the dotted line show peeled portions. Also, an image of an observed surface of a test piece that was not subjected to the ball-on disk test is shown in FIG. 25A for comparison.

As shown in FIG. 25B, much DLC film peeled off from the test piece that had not been subjected to surface modification treatment. Compared to this, peeling on the $O_2$ plasma-treated test pieces and $N_2$ plasma-treated test pieces was low, so it can be found that the adhesion strength and the abrasion resistance were enhanced (FIGS. 25C to H).

Example 3

Surface modification treatment was conducted by plasma radiation on a substrate (length: 10 mm×width: 10 mm×thickness: 1 mm) made of NiTi (manufactured by THE FURUKAWA ELECTRIC CO., LTD.) using the same conditions and procedure as those in example 1, and then a DLC film was formed. Like in example 1, an XPS measurement, a contact angle test, a tape test, a tensile test and a ball-on disk test were conducted.

XPS Measurement

The surface of the NiTi substrate after the surface modification treatment and before the formation of DLC film was measured by XPS under the same conditions as in example 1.

Figure 26:
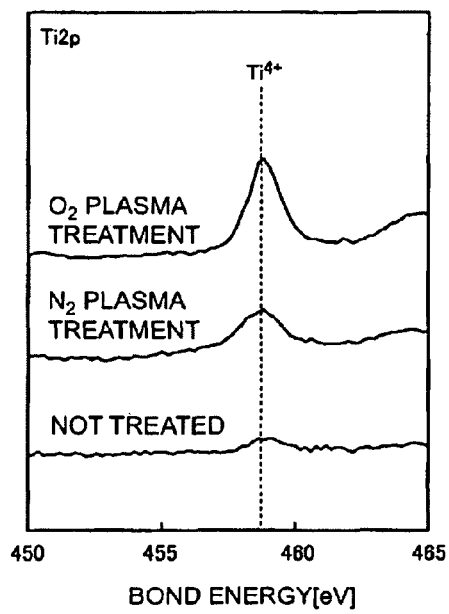
FIG. 26 is a diagram showing XPS results in example 3.
Figure 26:
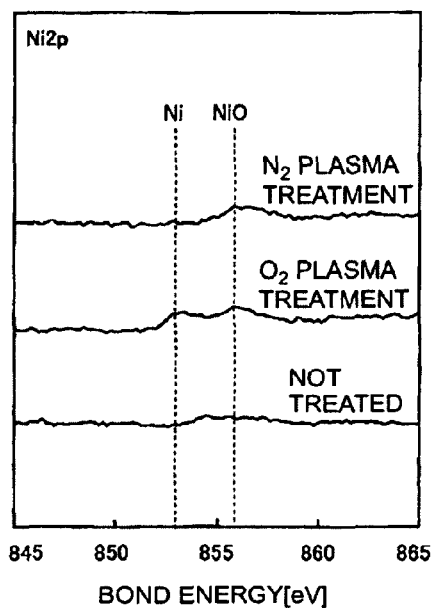
Figure 26:
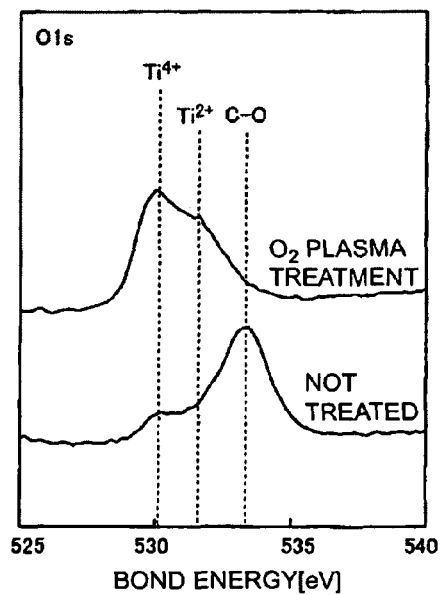
Figure 26:
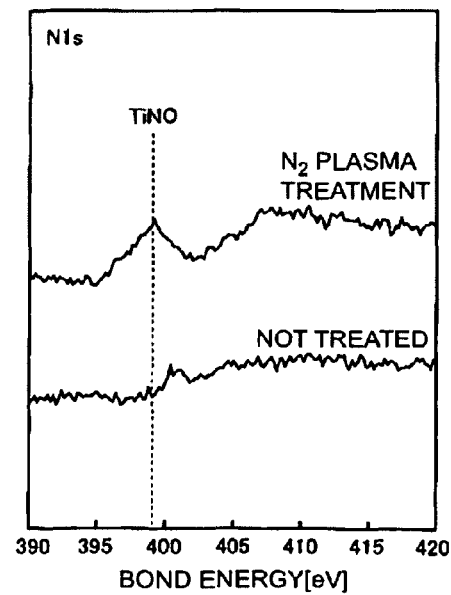

FIGS. 26A-D show diagrams showing the results of the XPS measurement for a NiTi substrate surface-modified by the $O_2$ plasma treatment, a NiTi substrate surface-modified by the $N_2$ plasma treatment and an untreated NiTi substrate that was not subjected to surface modification treatment. FIG. 26A shows a Ti2p spectrum, FIG. 26B shows a Ni2p spectrum, FIG. 26C shows an O1s spectrum and FIG. FIG. 26D shows a N1s spectrum.

As shown in FIG. 26A, in the Ti2p spectrum for the $O_2$ plasma-treated NiTi substrate, a $Ti^{4+}$ peak increased compared to those for the untreated NiTi substrate, which suggests the generation and increase of $TiO_2$. As shown in FIG. 26B, in the Ni2p spectrum for the $O_2$ plasma-treated NiTi substrate, the generation of NiO was observed at 856 eV. As shown in FIG. 26B, in the O1s spectrum for the $O_2$ plasma-treated NiTi substrate, a $Ti^{2+}$ peak and a $Ti^{4+}$ peak increased compared to those for the untreated NiTi substrate, which suggests the generation and increase of TiO and $TiO_2$.

As shown in FIG. 26D, in the N1s spectrum for the $N_2$ plasma-treated NiTi substrate, a TiNO peak was increased at 399.2 eV compared to those for the untreated NiTi substrate.

Figure 27:
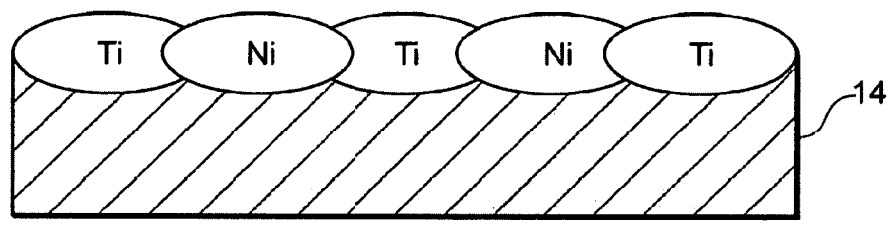
FIG. 27 is a schematic diagram showing modification states around a surface of an $O_2$ plasma-treated NiTi substrate.
Figure 27:
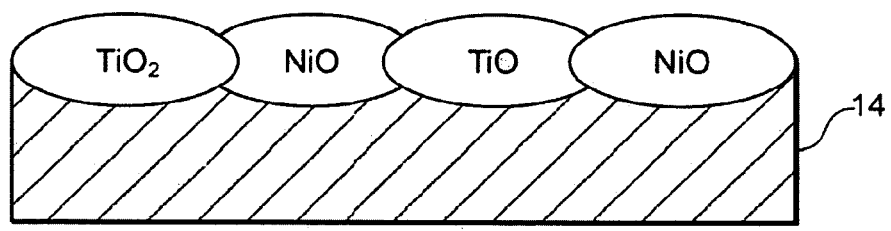
Figure 27:
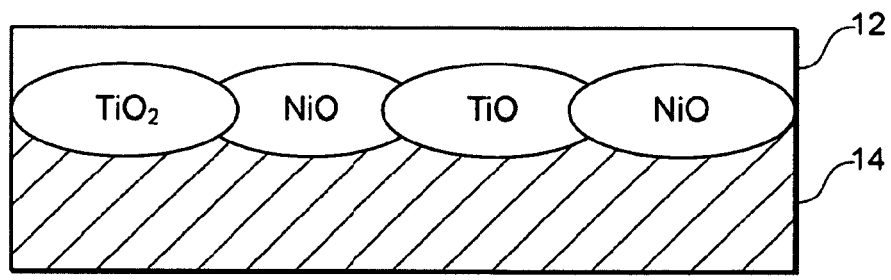
Figure 28:
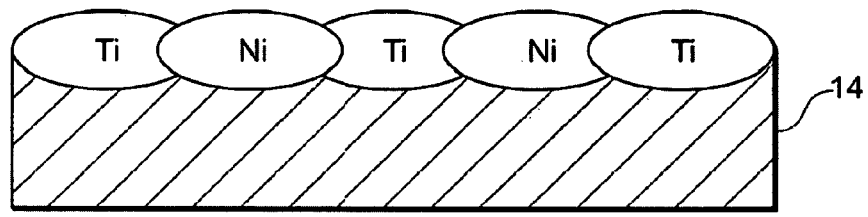
FIG. 28 is a schematic diagram showing modification states around a surface of a $N_2$ plasma-treated NiTi substrate.
Figure 28:
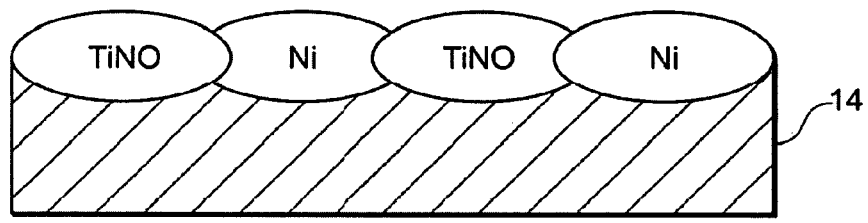
Figure 28:
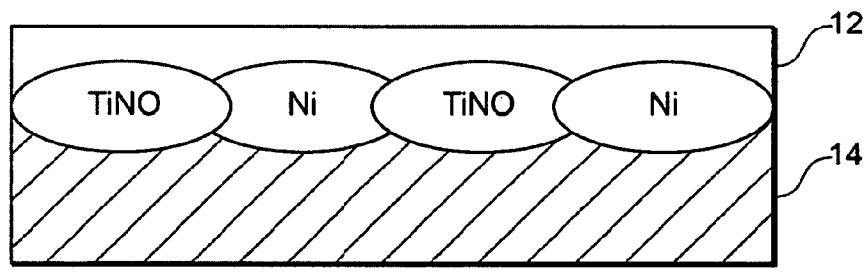
Figure 29:
FIG. 29 shows images each showing the result of a contact angle test in example 3.
Figure 29:
Figure 29:
Figure 29:
Figure 29:
Figure 29:
Figure 29:
Figure 32:
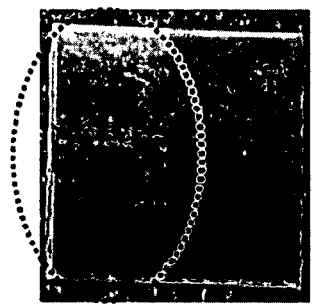
FIG. 32 shows images each showing the result of a tape test in example 3.
Figure 32:
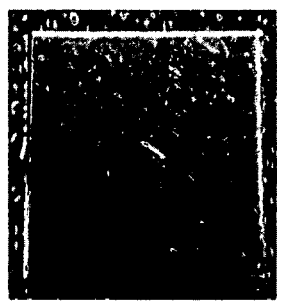
Figure 32:
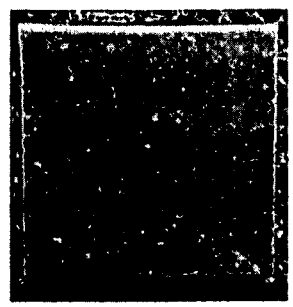
Figure 32:
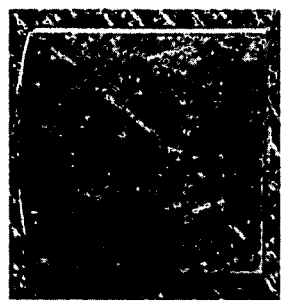
Figure 32:
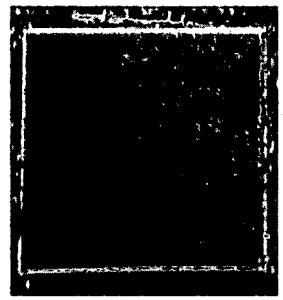
Figure 32:
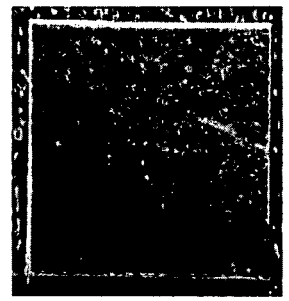
Figure 32:
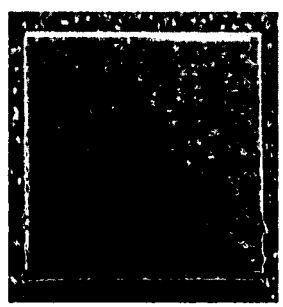

FIGS. 27A-C show schematic diagrams each showing a modification state around the surface of the $O_2$ plasma-treated NiTi substrate, and FIGS. 28A-C show schematic diagrams each showing a modification state around the surface of the $N_2$ plasma-treated NiTi substrate. As shown in FIGS. 27A and 28A, a portion close to the surface of a NiTi substrate 14 before the surface modification treatment is composed of Ni and Ti.

The results of the above XPS measurement indicate that TiO, $TiO_2$ and NiO were generated around the NiTi substrate 14 in the $O_2$ plasma treatment as shown in FIG. 27B and that TiNO was generated around the surface of the NiTi substrate 14 in the $N_2$ plasma treatment as shown in FIG. 28B.

Contact Angle Test

Wet-ability of the surface of the NiTi substrate after the surface modification treatment and before the formation of the DLC film was measured by the same contact angle test as that used in example 1.

Contact angles were measured for the NiTi substrate surface-modified by the $O_2$ plasma treatment, the NiTi substrate surface-modified by the $N_2$ plasma treatment and the untreated NiTi substrate. The contact angles were measured for the $O_2$ plasma-treated NiTi substrate and the $N_2$ plasma-treated NiTi substrates respectively with treatment times of 1, 5 and 10 minutes.

FIGS. 29A-G show images showing the results of the contact angle test for the NiTi substrates, FIG. 30 is a table showing the results of the contact angle test for the NiTi substrates and FIG. 31 is a table showing surface energies of the NiTi substrates calculated by Equation 1 described above. As shown in FIGS. 29A-G to 31, compared to the untreated NiTi substrate, the contact angle decreased and the surface energy increased in each of the $O_2$ plasma-treated NiTi substrates and $N_2$ plasma-treated NiTi substrates.

These results indicate that the chemical composition of the surface of each of the NiTi substrates is modified by the $O_2$ plasma treatment or $N_2$ plasma treatment. This is consistent with the results in the above-described XPS measurement in which TiO, $TiO_2$ and NiO were detected around the surface of the $O_2$ plasma-treated Ti substrate and TiNO was detected around the surface of the $N_2$ plasma-treated Ti substrate.

The increase of the surface energy of the NiTi substrate enhances the adhesion strength between the NiTi substrate and the DLC film. As shown in FIGS. 27C and 28C, by forming the DLC film 12 on the surface of the NiTi substrate 14 whose surface energy has been increased due to the surface modification, the adhesion strength of the DLC film 12 can be enhanced.

Tape Test

The adhesion strength between the NiTi substrate and the DLC film was observed using the same tape test as that used in example 1.

The test was conducted for test pieces prepared using the $O_2$ plasma treatment and $N_2$ plasma treatment respectively with treatment times of 1, 5 and 10 minutes. Also, the same test was conducted for a test piece prepared by forming a DLC film on an untreated NiTi substrate (treatment time: 0 minutes) for comparison.

FIGS. 32A-G show images showing the results of the tape test. The test was conducted using the left halves of the test pieces, and portions surrounded by the dotted line in the figure show peeled portions. Peeling was observed in the untreated test piece (FIG. 32A) but was not observed in the other test pieces, so it could be seen that adhesion strength increased due to the surface modification treatment.

Tensile Test

The adhesion strength between the NiTi substrate and the DLC film was measured using the same tensile test as that used in example 1.

The tensile test was conducted for test pieces prepared using the $O_2$ plasma treatment and $N_2$ plasma treatment respectively with treatment times of 1, 5 and 10 minutes. Also, the same test was conducted for a test piece prepared by forming a DLC film on an untreated NiTi substrate (treatment time: 0 minutes) for comparison. The measurement was conducted six times for each test piece. After the tensile test, peeling in each DLC film was checked by Raman spectroscopy.

Figure 33:
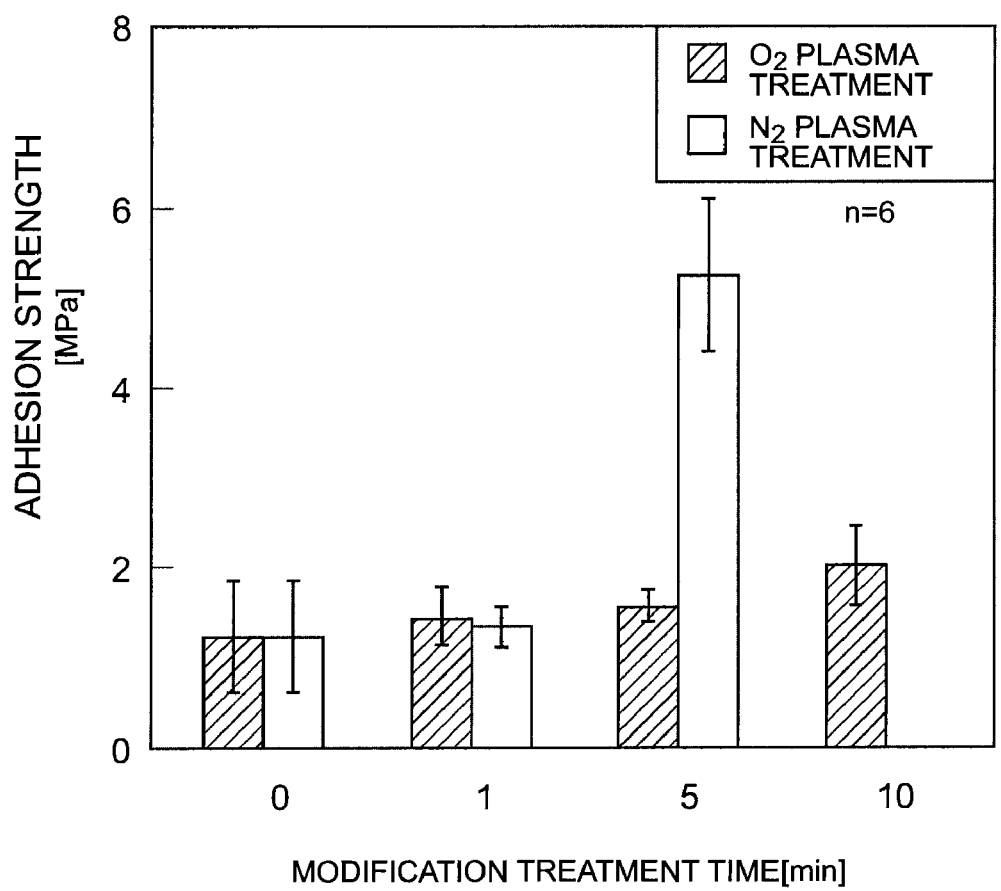
FIG. 33 is a diagram showing the result of a tensile test in example 3.
Figure 34:
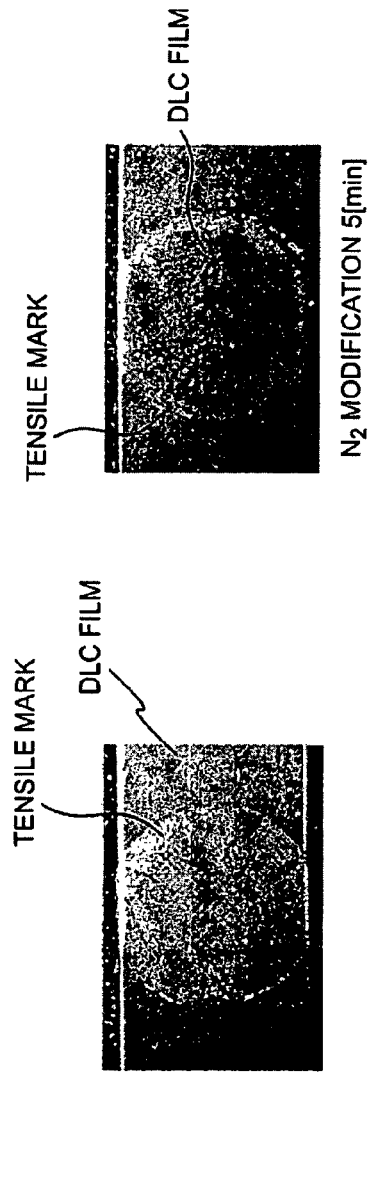
FIG. 34A is an image showing an example of a tensile mark in example 3.
FIG. 34B is an image showing a tensile mark on a test piece which has been $N_2$ plasma-treated for five minutes in example 3.
FIG. 34C is a diagram showing an example of a Raman spectrum for a test piece after the tensile test in example 3.
Figure 34:
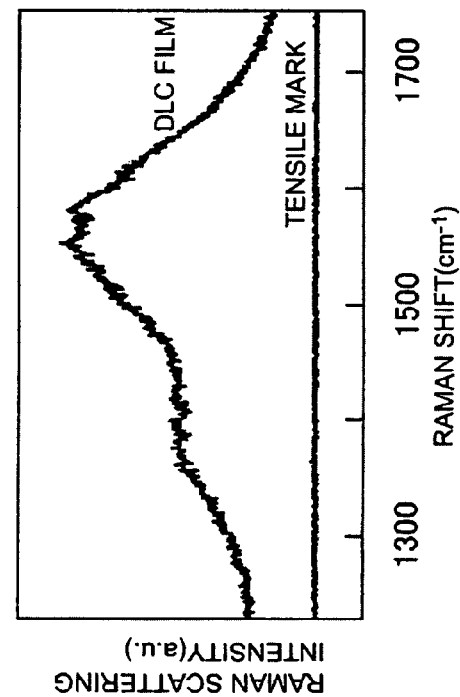

FIG. 33 is a diagram showing the result of the tensile test. FIG. 34A is an image showing an example of a tensile mark, FIG. 34B is an image showing a tensile mark on the test piece which was subjected to the $N_2$ plasma treatment for 5 minutes, and FIG. 34C is a diagram showing an example of a Raman spectrum for a test piece after the tensile test. As shown in FIG. 33, the adhesion strength increased by conducting the surface modification treatment, both by the $O_2$ plasma treatment and $N_2$ plasma treatment, and the adhesion strength increased with the increase in treatment time. FIGS. 34A and 34C show that the DLC film was peeled off cleanly.

The adhesion strength greatly increased in the $N_2$ plasma-treated test piece with a treatment time of 5 minutes. This is because, as shown in FIG. 34B, the DLC film was peeled off only at the circumference of the aluminum column 22 and the measured value in the tensile test was divided by the area of this peeled portion. Peeling of the DLC film could not be observed in the $N_2$ plasma-treated test piece with a treatment time of 10 minutes, so the adhesion strength could not be measured.

Abrasion Resistance Test

The abrasion resistance of the DLC film formed on the surface-modified NiTi substrate was evaluated using the same ball-on disk test as that used in example 1.

The test was conducted for test pieces prepared using the $O_2$ plasma treatment and $N_2$ plasma treatment respectively with 1, 5 and 10 minutes. Also, the same test was conducted for a test piece prepared by forming a DLC film on an untreated NiTi substrate (treatment time: 0 minutes).

Figure 35:
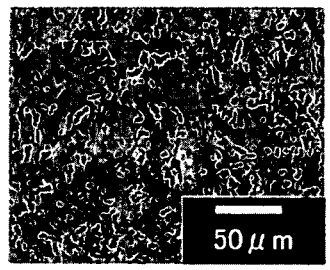
FIG. 35 shows images each showing a surface of a test piece observed after a ball-on disk test in example 3.
Figure 35:
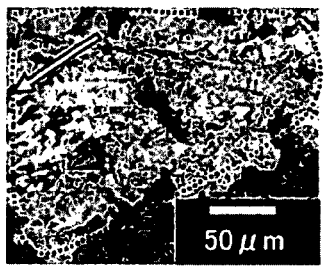
Figure 35:
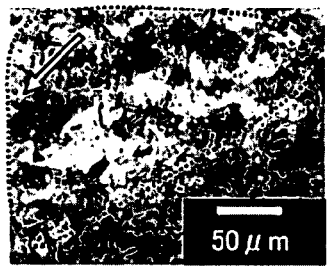
Figure 35:
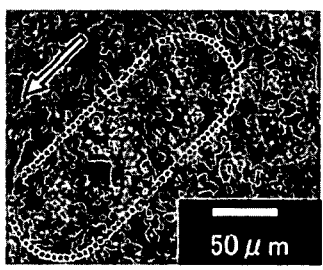
Figure 35:
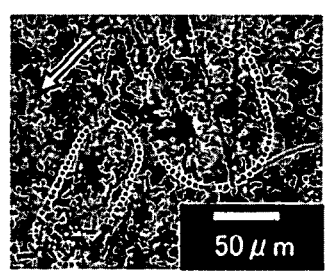
Figure 35:
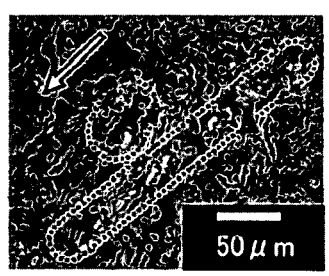
Figure 35:
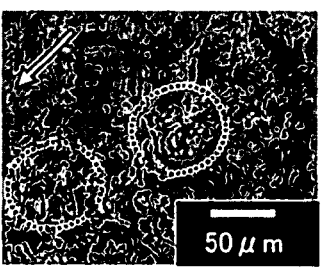
Figure 35:
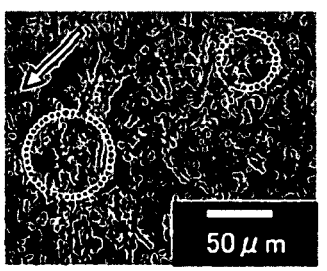

FIGS. 35A-H show images each showing test piece surfaces observed after the ball-on disk test. The arrows in the figure show a rotation direction in the test and the portions surrounded by the dotted line show peeled portions. Also, an image of the observed surface of a test piece which was not subjected to the ball-on disk test is shown in FIG. 35A for comparison.

As shown in FIG. 35(B), much DLC film peeled off from the test piece that had not been subjected to surface modification treatment. Compared to this, peeling on the $O_2$ plasma-treated test pieces and $N_2$ plasma-treated test pieces was low, so it can be found that adhesion strength and abrasion resistance were enhanced (FIG. 35C to H).

Example 4

Surface modification treatment was conducted by plasma radiation on a Ti (manufactured by NIKORA KABUSIKI-GAISHA) substrate (length: 10 mm×width: 10 mm×thickness: 1 mm) using the same conditions and procedure as those in example 1, and then a DLC film was formed. Like in example 1, an XPS measurement, a contact angle test, a tape test, a tensile test and a ball-on disk test were conducted.

XPS Measurement

The surface of the Ti substrate after the surface modification treatment and before the formation of a DLC film was measured by XPS under the same conditions as those in example 1.

Figure 36:
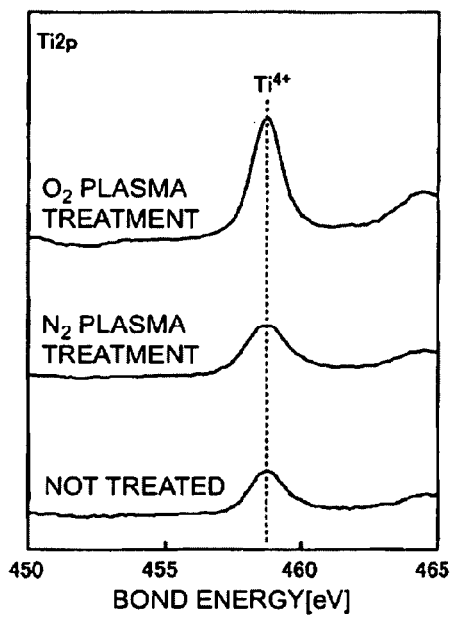
FIGS. 36A-C are diagrams showing XPS results in example 4.
Figure 36:
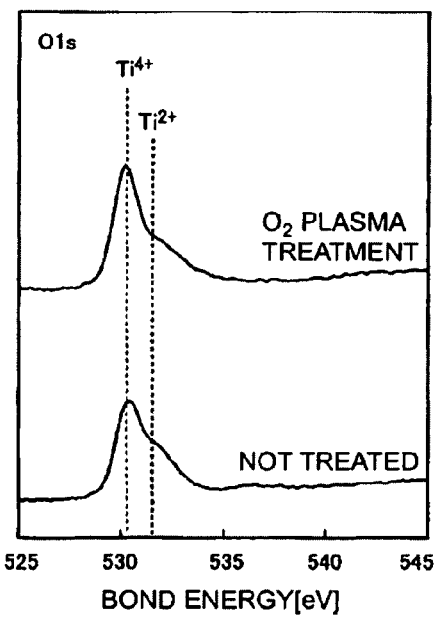
Figure 36:
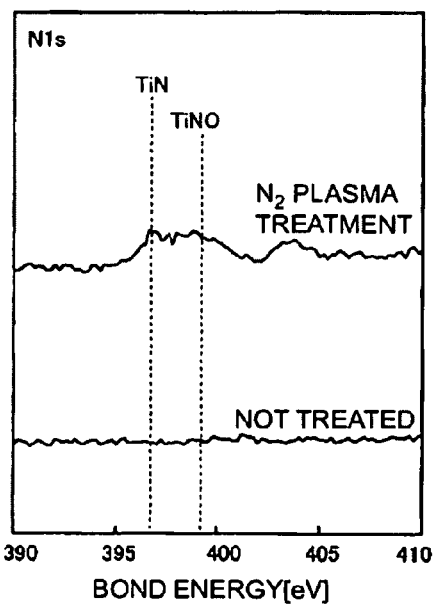

FIGS. 36A-C are diagrams showing the XPS results for a Ti substrate surface-modified by the $O_2$ plasma treatment, a Ti substrate surface-modified by the $N_2$ plasma treatment and an untreated Ti substrate that was not subjected to surface modification treatment. FIG. 36A shows a Ti2p spectrum, FIG. 36B shows an O1s spectrum and FIG. 36C shows an N1s spectrum.

As shown in FIG. 36A, in the Ti2p spectrum for the $O_2$ plasma-treated Ti substrate, a $Ti^{4+}$ peak was observed at 458.6 eV. As shown in FIG. 36B, in the O1s spectrum for the $O_2$ plasma-treated Ti substrate, a $Ti^{2+}$ peak and a $Ti^{4+}$ peak were observed, which suggests the generation of TiO and $TiO_2$.

As shown in FIG. 36C, in the N1s spectrum for the $N_2$ plasma-treated Ti substrate, the generation of TiN was observed at 397 eV, and the generation of TiNO was observed at 399 eV.

Figure 37:
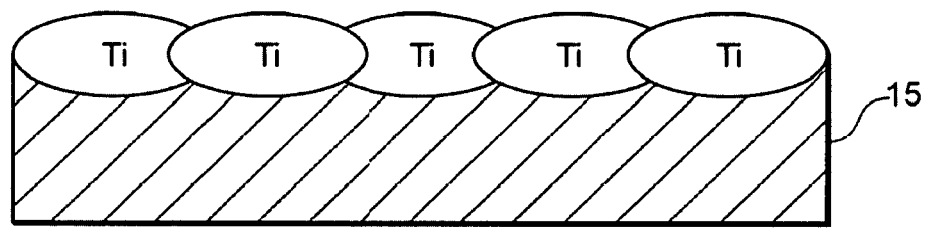
FIG. 37 is a schematic diagram showing modification states around a surface of an $O_2$ plasma-treated Ti substrate.
Figure 37:
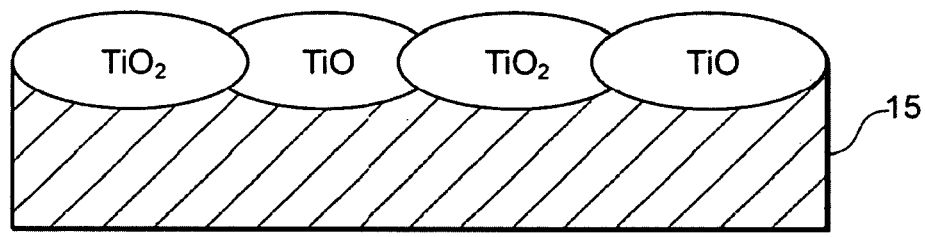
Figure 37:
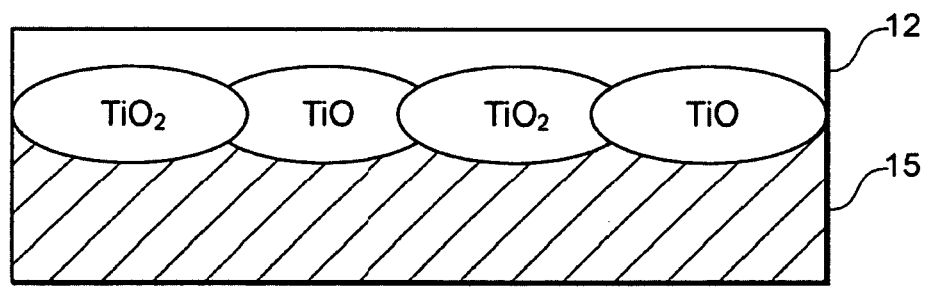
Figure 38:
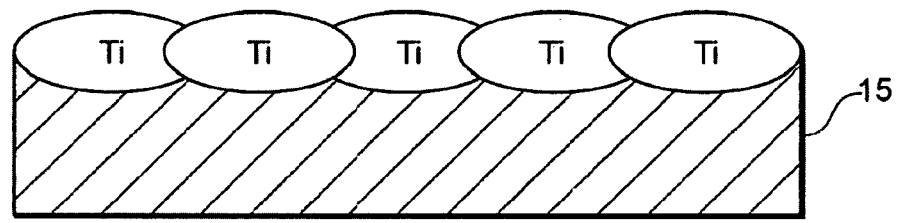
FIG. 38 is a schematic diagram showing modification states around a surface of a $N_2$ plasma-treated Ti substrate.
Figure 38:
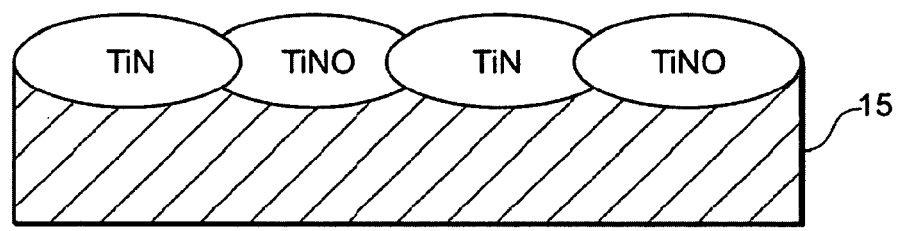
Figure 38:
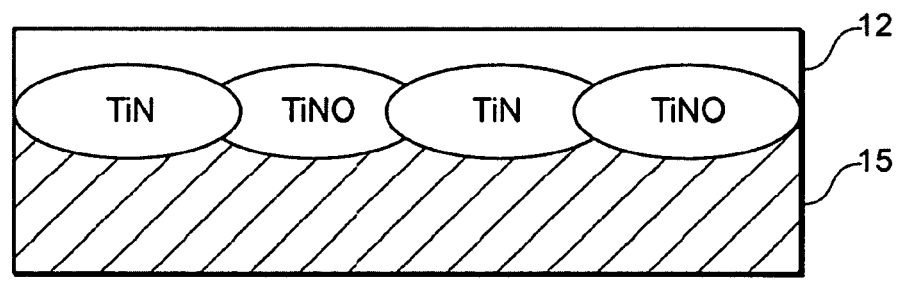
Figure 39:
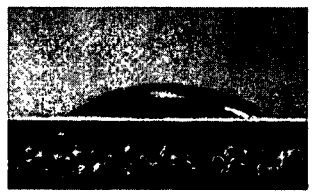
FIG. 39 shows images each showing the result of a contact angle test in example 4.
Figure 39:
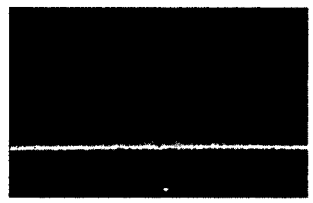
Figure 39:
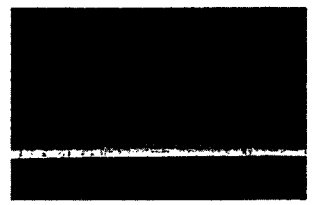
Figure 39:
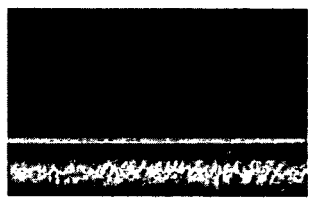
Figure 39:
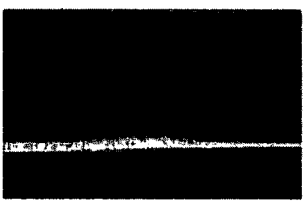
Figure 39:
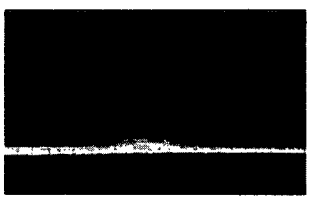
Figure 39:
Figure 42:
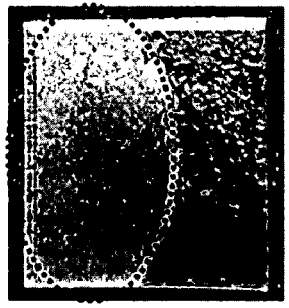
FIG. 42 shows images each showing the result of a tape test in example 4.
Figure 42:
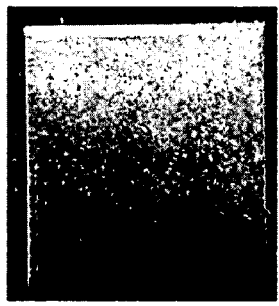
Figure 42:
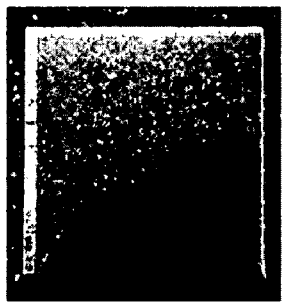
Figure 42:
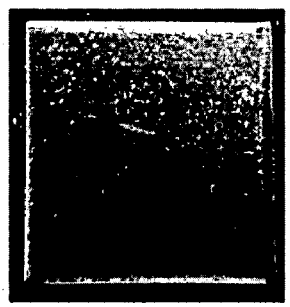
Figure 42:
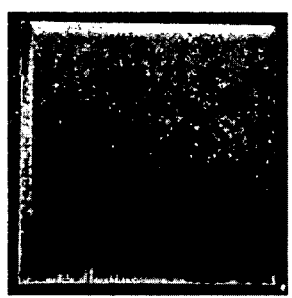
Figure 42:
Figure 42:
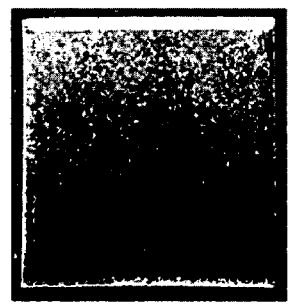

FIGS. 37A-C are schematic diagrams showing modification states around the surface of the $O_2$ plasma-treated Ti substrate and FIGS. 38A-C are schematic diagrams showing modification states around the surface of the $N_2$ plasma-treated Ti substrate. As shown in FIGS. 37A and 38A, the portion around the surface of a Ti substrate 15 before the surface modification treatment is composed of Ti.

The results of the above XPS measurement indicate that TiO and $TiO_2$ were generated around the surface of the Ti substrate 15 in the $O_2$ plasma treatment as shown in FIG. 37B, and TiN and TiNO were generated around the surface of the Ti substrate 15 in the $N_2$ plasma treatment as shown in FIG. 38B.

Contact Angle Test

Wet-ability of the surface of the Ti substrate after the surface modification treatment and before the formation of the DLC film was measured using the same contact angle test as that used in example 1.

The contact angle was measured for the Ti substrate surface-modified by the $O_2$ plasma treatment, the Ti substrate surface-modified by the $N_2$ plasma treatment, and an untreated Ti substrate. The contact angles were measured for the $O_2$ plasma-treated Ti substrates and $N_2$ plasma-treated Ti substrates respectively with treatment times of 1, 5 and 10 minutes.

FIGS. 39A-G show images showing the results of the contact angle test of the Ti substrates, FIG. 40 is a table showing the results of the contact angle test, and FIG. 41 is a table showing the surface energies of the Ti substrates calculated using Equation 1 described above. As shown in FIGS. 39A-G to 41, the contact angle decreased and the surface energy increased in each of the $O_2$ or $N_2$ plasma-treated substrates compared to the untreated Ti substrate.

This result indicates that the chemical composition of the surface of the Ti substrate was modified by the $O_2$ plasma treatment or $N_2$ plasma treatment. The result is consistent with the result in the above-described XPS measurement in which TiO and $TiO_2$ were detected around the surface of the $O_2$ plasma-treated Ti substrate and TiN and TiNO were detected around the surface of the $N_2$ plasma-treated substrate.

The increase in the surface energy of the Ti substrate enhances the adhesion strength between the Ti substrate and the DLC film. As shown in FIGS. 37C and 38C, by forming the DLC film 12 on the surface of the Ti substrate 15 whose surface energy has been increased due to the surface modification, the adhesion strength of the DLC film 12 can be enhanced.

Tape Test

The adhesion strength between the Ti substrate and the DLC film was observed using the same tape test as that used in example 1.

The test was conducted for test pieces prepared using the $O_2$ plasma treatment and $N_2$ plasma treatment respectively with treatment times of 1, 5 and 10 minutes. Also, the same test was conducted for a test piece prepared by forming a DLC film on an untreated Ti substrate (treatment time: 0 minutes) for comparison.

FIGS. 42A-G show images showing the results of the tape test. The test was conducted using the left halves of the test pieces, and the portions surrounded by the dotted line in the figure show peeled portions. Peeling was observed in the untreated test piece (FIG. 42A), but no peeling was observed in the other test pieces, so it can be found that the adhesion strength was enhanced.

Tensile Test

The adhesion strength between the Ti substrate and the DLC film was measured using the same tensile test as that used in example 1.

The tensile test was conducted for test pieces prepared using the $O_2$ plasma treatment and $N_2$ plasma treatment respectively with treatment times of 1, 5 and 10 minutes. The measurement was conducted 6 times for each test piece. Also, peeling of the DLC film was checked by Raman spectroscopy after the tensile test.

Figure 43:
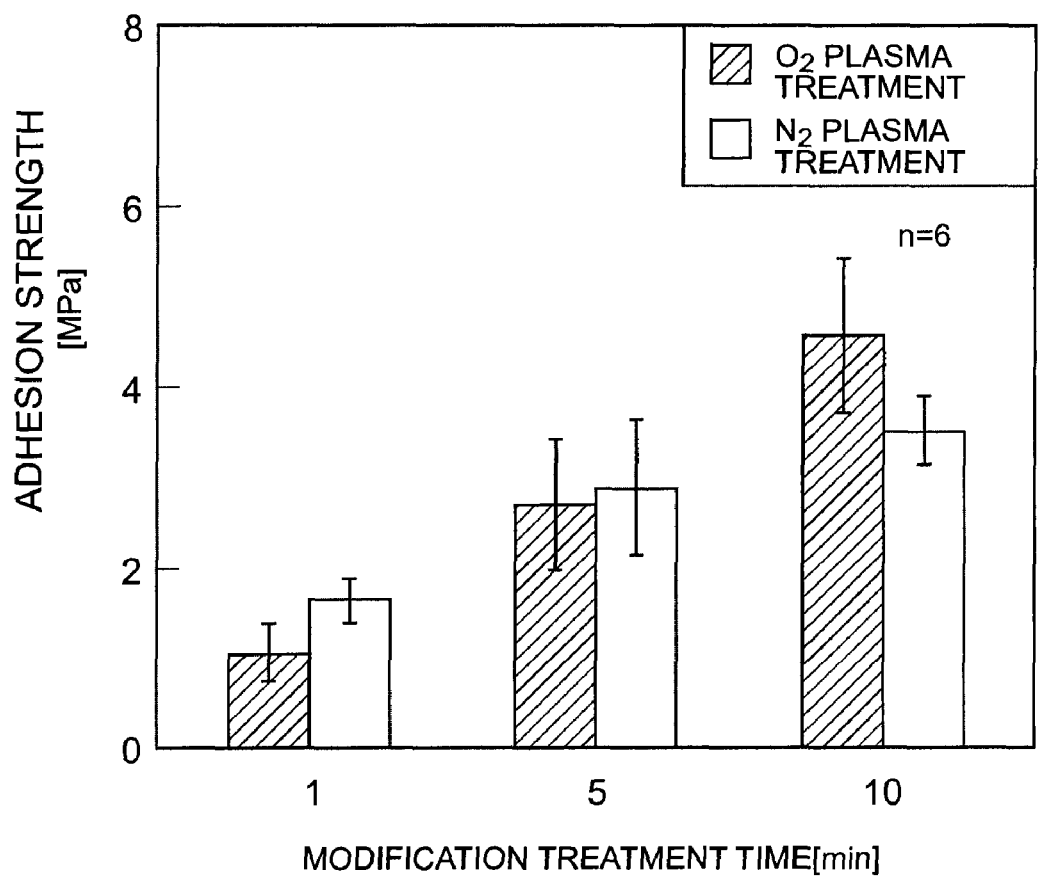
FIG. 43 is a diagram showing the result of a tensile test in example 4.
Figure 44:
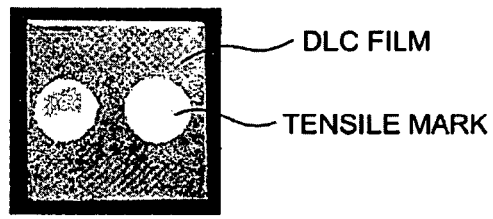
FIG. 44A is an image showing an example of a tensile mark in example 4.
FIG. 44B is a diagram showing an example of a Raman spectrum for a test piece after the tensile test in example 4.
FIG. 44C is an image showing a test piece prepared by forming a DLC film on an untreated Ti substrate.
Figure 44:
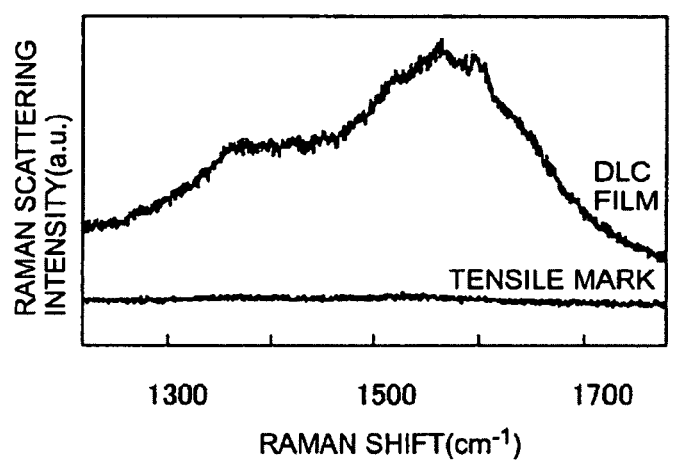
Figure 44:
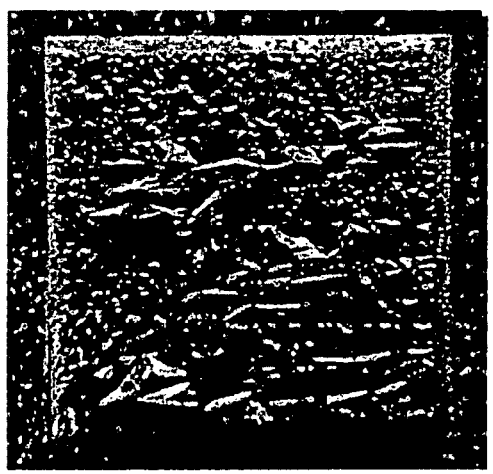

FIG. 43 is a diagram showing the result of the tensile test, FIG. 44A is an image showing an example of a tensile mark, FIG. 44B is a diagram showing an example of a Raman spectrum for a test piece after the tensile test, and FIG. 44C is an image showing the test piece prepared by forming the DLC film on the untreated Ti substrate (treatment time: 0 minute). As shown in FIG. 43, the adhesion strength increased with the increase in treatment time both in the $O_2$ plasma treatment and $N_2$ plasma treatment. FIGS. 44A and 44B show that the DLC film was peeled off cleanly.

The reason why no test result for the test piece prepared by forming the DLC film on the untreated Ti substrate (treatment time: 0 minute) is provided is that the DLC film peeled off so much, as shown in FIG. 44C, that the tensile test could not be conducted.

Abrasion Resistance Test

The abrasion resistance of the DLC film formed on the surface-modified Ti substrate was evaluated using the same ball-on disk test as that used in example 1.

The test was conducted for test pieces prepared using the $O_2$ plasma treatment and $N_2$ plasma treatment respectively with treatment times of 1, 5 and 10 minutes.

Figure 45:
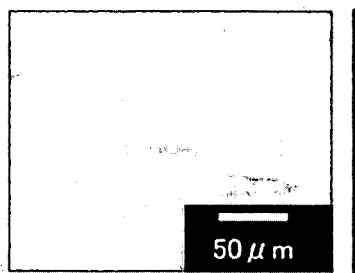
FIG. 45 shows images each showing a surface of a test piece observed after a ball-on disk test in example 4.
Figure 45:
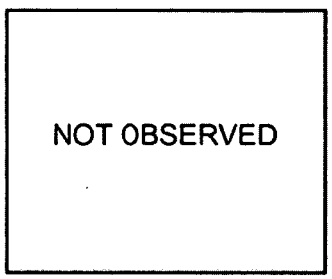
Figure 45:
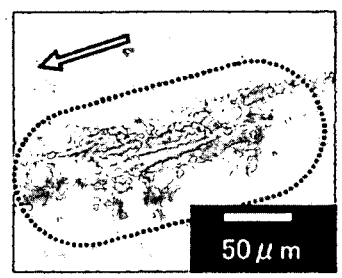
Figure 45:
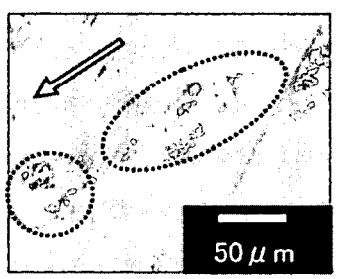
Figure 45:
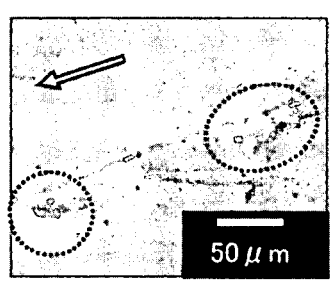
Figure 45:
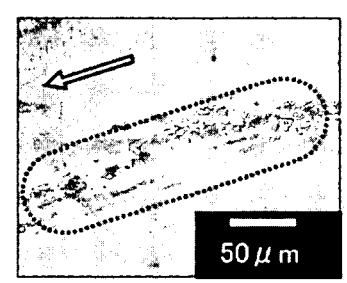
Figure 45:
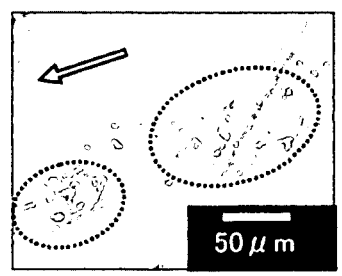
Figure 45:
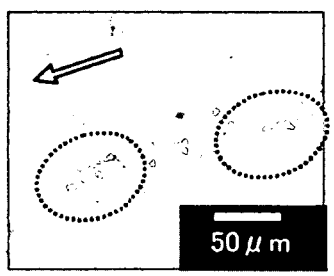

FIGS. 45A-H show the image of the surfaces of the test pieces after the ball-on disk test. The arrows in the figure show a rotation direction in the test, and the portions surrounded by the dotted line show peeled portions. Also, an image of an observed surface of a test piece which was not subjected to the ball-on disk test is shown in FIG. 45A for comparison. Note that the DLC film formed on the test piece prepared by forming the DLC film on the untreated Ti substrate (treatment time: 0 minute) peeled off greatly, so the ball-on disk test could not be conducted (FIG. 45B).

As shown in FIGS. 45C to H, peeling in the $O_2$ plasma treated test pieces and $N_2$ plasma-treated test pieces became less with the increase in treatment time, so it could be seen that adhesion strength and abrasion resistance were enhanced.

What is claimed is:

1. A method for forming a diamond-like carbon film, comprising:
    modifying a surface of a substrate comprising a metallic material by plasma radiation comprising nitrogen as a reaction gas to form a modified surface substrate; and
    forming a diamond-like carbon film on the modified surface substrate by chemical vapor deposition;
    wherein the substrate consists of nitinol or titanium.

2. The method of claim 1, wherein methane, acetylene, or benzene are used in the chemical vapor deposition.

3. The method of claim 1, wherein the chemical vapor deposition is a plasma chemical vapor deposition method.

4. The method of claim 1, wherein a temperature of the plasma radiation is from about 25° C. to about 300° C.

5. The method of claim 1, wherein the chemical vapor deposition is performed at a temperature of less than about 300° C.

6. The method of claim 1, wherein a thickness of the diamond-like carbon film is from about 0.01 μm to about 1 μm.

7. The method of claim 1, wherein the forming of the diamond-like carbon film is performed at a pressure of about 0.01 Pa to about 100 Pa.

* * * * *

UNITED STATES PATENT AND TRADEMARK OFFICE
CERTIFICATE OF CORRECTION

PATENT NO. : 8,394,455 B2  
APPLICATION NO. : 12/175128  
DATED : March 12, 2013  
INVENTOR(S) : Hirakuri et al.

Page 1 of 1

It is certified that error appears in the above-identified patent and that said Letters Patent is hereby corrected as shown below:

On the Title Page, in Item (56), under "OTHER PUBLICATIONS", in Column 2, Line 1, delete "al." and insert -- al., --, therefor.

On the Title Page, in Item (56), under "OTHER PUBLICATIONS", in Column 2, Line 4, delete "al." and insert -- al., --, therefor.

On the Title Page, in Item (56), under "OTHER PUBLICATIONS", in Column 2, Line 4, delete "Cabon" and insert -- Carbon --, therefor.

On the Title Page, in Item (56), under "OTHER PUBLICATIONS", in Column 2, Line 5, delete "inc." and insert -- Inc. --, therefor.

In the Specification

In Column 4, Line 4, delete "DESCRIPTION" and insert -- DETAILED DESCRIPTION --, therefor.

In Column 8, Line 57, delete "spectroscopy" and insert -- spectroscopy. --, therefor.

In Column 9, Line 38, delete "FIG. 15C to N))." and insert -- (FIG. 15C to N). --, therefor.

Signed and Sealed this  
Eleventh Day of June, 2013

Teresa Stanek Rea  
*Acting Director of the United States Patent and Trademark Office*